(12) United States Patent
Lin

(10) Patent No.: US 6,420,273 B1
(45) Date of Patent: Jul. 16, 2002

(54) SELF-ALIGNED ETCH-STOP LAYER FORMATION FOR SEMICONDUCTOR DEVICES

(75) Inventor: Xi-Wei Lin, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/394,866

(22) Filed: Sep. 13, 1999

Related U.S. Application Data

(63) Continuation of application No. 08/885,741, filed on Jun. 30, 1997, now abandoned.

(51) Int. Cl.[7] .............................................. H01L 21/302
(52) U.S. Cl. ....................... 438/706; 438/721; 438/723; 438/724
(58) Field of Search ................................ 438/396, 397, 438/398, 653, 654, 656, 664, 721, 723, 724

(56) References Cited

U.S. PATENT DOCUMENTS

| | | | |
|---|---|---|---|
| 4,466,172 A | 8/1984 | Batra | 29/571 |
| 4,826,781 A | 5/1989 | Asahina et al. | 437/41 |
| 5,041,394 A | 8/1991 | Spratt et al. | 437/200 |
| 5,045,483 A | 9/1991 | DeLong et al. | 437/31 |
| 5,124,280 A | 6/1992 | Wei et al. | 437/193 |
| 5,168,072 A | 12/1992 | Moslehi | |
| 5,244,837 A | 9/1993 | Dennison | 437/195 |
| 5,268,330 A | 12/1993 | Givens et al. | 437/195 |
| 5,292,677 A | 3/1994 | Dennison | |
| 5,371,047 A | 12/1994 | Greco et al. | 437/238 |
| 5,411,909 A | 5/1995 | Manning et al. | 437/52 |
| 5,459,100 A | 10/1995 | Choi | 437/195 |
| 5,496,771 A | 3/1996 | Cronin et al. | 437/187 |
| 5,516,726 A | 5/1996 | Kim et al. | 437/189 |
| 5,545,581 A | 8/1996 | Armacost et al. | 437/52 |
| 5,595,937 A | 1/1997 | Mikagi | 437/192 |
| 5,668,052 A | 9/1997 | Matsumoto et al. | 438/624 |
| 5,672,535 A | 9/1997 | Shrivastava et al. | 437/52 |
| 5,683,941 A | 11/1997 | Kao et al. | 437/200 |
| 5,723,387 A | 3/1998 | Chen | 438/692 |
| 5,731,239 A * | 3/1998 | Wong et al. | 438/296 |
| 5,741,626 A | 4/1998 | Jain et al. | 430/314 |
| 5,780,349 A | 7/1998 | Naem | 437/41 |
| 5,795,827 A | 8/1998 | Liaw et al. | 438/664 |
| 5,843,834 A | 12/1998 | Naem | 438/564 |
| 5,907,188 A * | 5/1999 | Nakajima et al. | 438/653 |
| 5,953,612 A * | 9/1999 | Lin et al. | 438/759 |

* cited by examiner

Primary Examiner—Benjamin L. Utech
Assistant Examiner—Duy-Vu Deo
(74) Attorney, Agent, or Firm—Peter Zawilski

(57) ABSTRACT

A technique for self-aligned processing of semiconductor device features is disclosed. This technique includes the formation of a semiconductor device with transistor gates having a polysilicon member that extends from the plane of a semiconductor substrate. A coating is deposited on the gates and substrate. Chemical mechanical polishing is performed to remove a portion of the coating to expose a polysilicon surface of the gates without lithographic processing. A recess is formed in the exposed polysilicon surface and at least partially filled with an etch stop material such as silicon nitride. Silicidation of the polysilicon member to form a silicide layer in the recess or a selective chemical vapor deposition on the bottom of the recess with an appropriate metal may be performed before filling the recess with the etch stop material.

21 Claims, 14 Drawing Sheets

SELF-ALIGNED ETCH-STOP LAYER FORMATION FOR SEMICONDUCTOR DEVICES

RELATED APPLICATION DATA

This application is a continuation of application, Ser. No. 08/885,741 filed Jun. 30, 1997 abandoned on Sep. 14, 1999.

BACKGROUND OF THE INVENTION

The present invention relates to self-aligned processing of a semiconductor device, and more particularly, but not exclusively relates to a technique to provide a self-aligned etch stop layer.

The advance of Integrated Circuit (IC) technology toward high density, high performance integration is achieved not only by decreasing feature size, but also by an increased tolerance to misalignments relative to the features. Such misalignments usually occur during later processing phases of semiconductor device fabrication. This tolerance arises in some instances because the semiconductor features, such as transistor gates, are becoming so small that standard lithographic technology is incapable of repeatedly defining structures relative to the gate without some variation in location. The resulting misalignments typically occur when metal contacts to a transistor are being lithographically defined.

In order to manage such misalignments, specially defined etch stops are sometimes utilized. Unfortunately, these approaches often require the placement of an etch stop layer on transistor gates during initial patterning. This approach precludes the ability to perform other processes to the gate without extensively complicating the overall fabrication process. For example, the placement of a nitride etch stop on the transistor gate during initial processing prevents self-aligned silicidation of the gate in later stages. Also, p+ and n+ gate implantation common to CMOS processing cannot be performed once the etch stop is in place. Moreover, adding the etch stop in a later stage with a dedicated mask and lithographic procedure would suffer from the same misalignment problems as contact placement.

Thus, there is a need for a technique to provide a gate etch-stop without resorting to a mask or lithographic procedure. The present invention meets this need and provides other important advantages.

SUMMARY OF THE INVENTION

The present invention relates to self-aligned processing of semiconductor devices. Various aspects of the invention are novel, non-obvious, and provide various advantages. While the actual nature of the invention covered herein may only be determined with reference to the claims appended hereto, certain aspects which are characteristic of the preferred embodiments disclosed herein are described briefly as follows.

One aspect of the present invention is a self-aligned etch stop to increase process tolerance to misaligned semiconductor contacts.

In another aspect, a self-aligned gate etch-stop is provided by coating a semiconductor device that defines a field effect transistor structure. The structure has a source contact region and a drain contact region with a gate positioned therebetween. A portion of the coating is removed to define a generally planar surface along the coating and expose a portion of the gate. The exposed gate may have a surface generally coplanar with the coating surface by virtue of this removal stage. A recess is formed in the surface by removing a portion of the gate material. An etch stop barrier is deposited, at least partially filling the recess and contacting the surface. A portion of the barrier is removed, reexposing the coating, but leaving the recess at least partially filled with the barrier.

In still another aspect, a self-aligned gate etch-stop is provided by coating a semiconductor device that defines a field effect transistor structure. The structure has a source contact region and a drain contact region with a gate positioned therebetween. A portion of the coating is removed by chemical-mechanical polishing to expose a portion of the gate. A recess is formed in the exposed the gate by removing at least a portion of the gate material. An etch stop barrier is deposited, at least partially filling the recess and contacting the surface. A portion of the barrier is removed, reexposing the coating, but leaving the recess at least partially filled with the barrier. The barrier may also be removed by an appropriate chemical-mechanical polishing technique.

An additional aspect of the present invention is a process for manufacturing an integrated circuit that includes defining a region of a silicon substrate for formation of a field effect transistor. The region is bounded by a field isolation structure and includes a source, a drain, and a gate positioned between the source and drain. The gate includes a gate oxide pad formed on the substrate and a polysilicon gate member formed on the gate oxide pad. The polysilicon member has a thickness extending above the source and drain and is bounded by a pair of spacer walls. During the process, the source, the drain, the gate, and the spacer walls are covered with a silicon nitride liner and a silicon dioxide layer is deposited on the silicon nitride liner. At least a portion of the silicon nitride liner and the silicon dioxide layer have a combined thickness greater than the thickness of the polysilicon member. This process includes removing a portion of the silicon dioxide layer by chemical mechanical polishing to expose the polysilicon member without exposing the source or drain to thereby define a first generally planar surface; and etching the exposed polysilicon member to controllably form a recess relative to the first generally planar surface. A self-aligned silicidation process is performed to form a silicide layer in the recess. Alternatively, a chemical vapor deposition of a metal, such as tungsten, may be employed to partially fill the recess. A silicon nitride layer is provided that fills the recess and covers the first generally planar surface. A part of the silicon nitride layer is removed to reexpose the silicon dioxide layer and leave a portion of the silicon nitride layer in the recess on top of the silicide layer. The formation of the field effect transistor is then completed.

In a further aspect of the present invention, a number of semiconductor device features are formed that extend from a semiconductor substrate. These features are spaced apart from each other to define a corresponding number of gaps therebetween. The features and the substrate are coated. The resulting coating occupies at least a portion of each of the gaps. A portion of the coating farthest away from the substrate is removed by chemical-mechanical polishing to expose each of the features. A self-aligned process is performed with the features exposed by the removal. The features may be transistor gates.

An additional aspect of the present invention includes: (a) forming a semiconductor device feature that extends from a semiconductor substrate; (b) covering the feature and the substrate with a coating; (c) removing a part of the coating farthest away from the substrate to form a generally planar region along the coating and expose the feature; and (d)

performing a self-aligned process to the exposed feature. The removal of coating may include the removal of part of the feature to define a feature surface and a coating surface that are generally coplanar. Also, the feature may include a polysilicon member of a field effect transistor gate.

Accordingly, it is one object of the present invention to provide a self-aligned technique for modifying features of a semiconductor device. This technique may include providing a self-aligned gate etch stop.

It is another object of the present invention to perform a self-aligned process to modify a transistor gate so that misalignment of transistor contacts may be better tolerated.

It is still another object of the present invention to define a recess in a polysilicon gate member for filling by an etch stop material such as silicon nitride.

Further objects, features, benefits, aspects, and advantages of the present invention shall become apparent from the detailed drawings and descriptions provided herein.

DESCRIPTION OF THE PREFERRED EMBODIMENTS

Figure 1A:
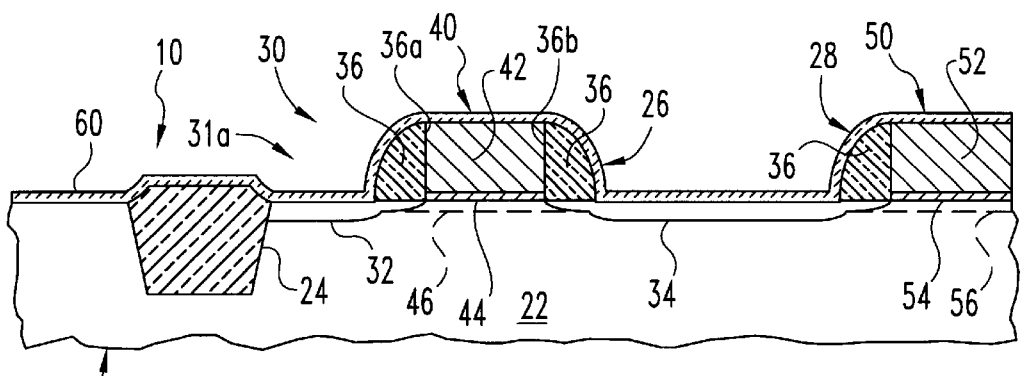
FIGS. 1a–1f are partial cross-sectional views of an integrated circuit at certain progressive stages of a first self-aligned silicidation process of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described processes, systems, or devices, and any further applications of the principles of the invention as described herein are contemplated as would normally occur to one skilled in the art to which the invention relates.

As used herein, the terms "silicon dioxide" and "oxide" refer broadly to a material containing silicon and oxygen that may include stoichiometric variations and impurities that do not substantially interfere with desired functional attributes of the material. Furthermore, as used herein, the terms "silicon nitride" and "nitride" refer broadly to a material containing silicon and nitrogen that may include stoichiometric variations and impurities that do not substantially interfere with desired functional attributes of the material. A chemical compound formula will be utilized herein to designate a specifically desired stoichiometric compound of silicon.

Self-aligned silicidation, sometimes called "SALICIDE," is an important aspect of manufacturing integrated circuits with submicron dimensions. As process technology advances, the integrated circuit device features continue to shrink. One feature of the present invention is a technique to achieve low sheet resistance of the silicidation layer of a polysilicon gate of a field effect transistor, and at the same time minimize junction leakage at active silicon source/drain areas.

In one aspect of this technique, self-aligned silicidation of a field effect transistor gate is decoupled from the self-aligned silicidation of source and drain areas of the transistor. FIGS. 1a–1f progressively illustrate certain stages of self-aligned silicidation process 10 of one embodiment of the present invention. In FIG. 1a, an intermediate processing stage of an Integrated Circuit (IC) 20 is illustrated in cross-section. IC 20 includes substrate 22, formed from a generally planar semiconductor material such as silicon. Preferably, substrate 22 generally extends along a plane perpendicular to the view plane of FIGS. 1a–1f. IC 20 has a field isolation structure 24 configured as a trench filled with silicon dioxide. Structure 24 is of the type that may be formed by a conventional shallow trench isolation process during an initial processing stage of IC 20. Structure 24 bounds a semiconductor device region 30 with several semiconductor device features 31a extending from substrate 22, including field effect transistors 26 and 28, where transistor 28 is only partially shown. Transistor 26 has source region 32 and drain region 34 which is shared with transistor 28. As the rest of IC 20, transistors 26, 28 are illustrated in an intermediate stage of formation in FIG. 1a.

Transistor 26 includes gate 40 bounded by walls 36a, 36b of spacers 36. Transistor 28 includes gate 50 with spacer 36. Spacers 36 are preferably formed from an oxide of silicon or a nitride of silicon. Gates 40, 50 include polysilicon layer members 42, 52 on gate oxide pads 44, 54 to define channel regions 46, 56. Notably, gates 40, 50 project or extend above substrate 22 in a direction substantially perpendicular to the plane along which substrate 22 extends.

In one preferred embodiment, transistors 26, 28 are formed after isolation structure 24, using a frontend process to define transistors 26, 28 as CMOS components. This frontend processing may include the establishment of corresponding n- and p-wells in substrate 22 using standard techniques. After well formation, it is preferred a suitable gate oxide layer be formed on substrate 22. In one example, the thickness of the gate oxide layer is about 54 Angstroms. After formation of the gate oxide layer for the CMOS process, an amorphous silicon layer is deposited. The polysilicon members 42, 52 and pads 44, 54 are patterned from the amorphous silicon layer and silicon dioxide layer, respectively, using standard lithographic techniques. Next, a conventional Lightly Doped Drain (LDD) stage is performed and spacers 36 are then formed as part of the CMOS frontend process.

After these stages, implant screen oxide layer 60 is formed as illustrated in FIG. 1a, and implantation of n+ and p+ dopant is performed. For example, n+ implantation may be accomplished by implanting ionized As at 60 keV $2 \times 10^{15}$ cm$^{-2}$; and p+ implantation may be accomplished by implanting ionized $BF_2$ at 50 keV $3\times10^{15}$ cm$^{-2}$ to form CMOS structures.

For this example, implantation is followed by a Rapid Thermal Anneal (RTA) at about 1000 degrees Celsius for about 30 seconds to activate the implanted dopants. Frontend processing also changes the crystal lattice of the amorphous silicon layer into polysilicon. In another embodiment, the initial processing of IC 20 is configured to provide NMOS devices using conventional techniques. In still other embodiments, it is contemplated that IC 20 is formed by different frontend processes known to those skilled in the art.

Figure 1B:
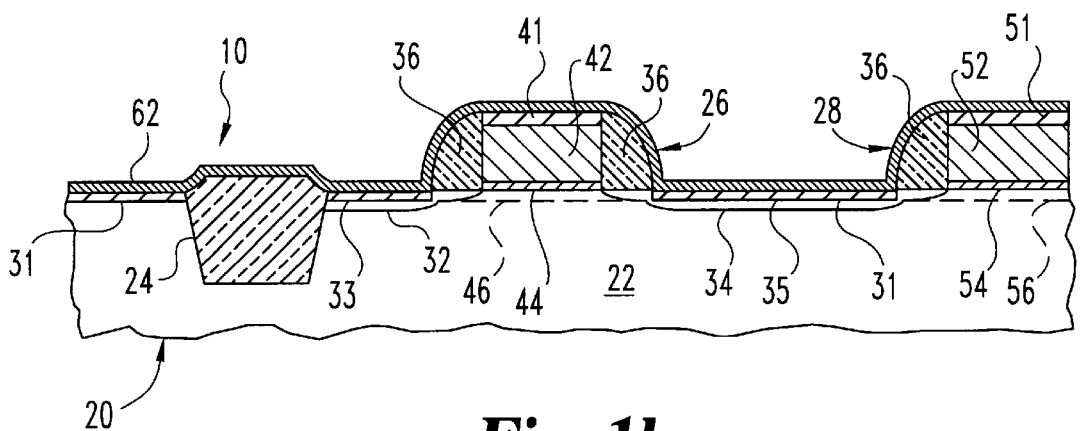

In FIG. 1b, IC 20 has been further processed by removing implant screen oxide layer 60 and cleaning the surface after removal. FIG. 1b depicts metallic layer 62 deposited to cover transistors 26 and 28. Preferably, metallic layer 62 is substantially formed from an elemental metal such as titanium (Ti), cobalt (Co), or nickel (Ni); although other materials suitable for silicidation are also contemplated. A first Rapid Thermal Anneal (RTA) is performed to form silicide by combining metal atoms from layer 62 with silicon in contact therewith. Intermittent silicide layer 31 results where metal layer 62 and silicon from either substrate 22 or polysilicon members 42, 52 are in contact. Silicide layer 31 includes source silicide region 33, drain silicide region 35, and gate silicide regions 41, 51.

Figure 1C:
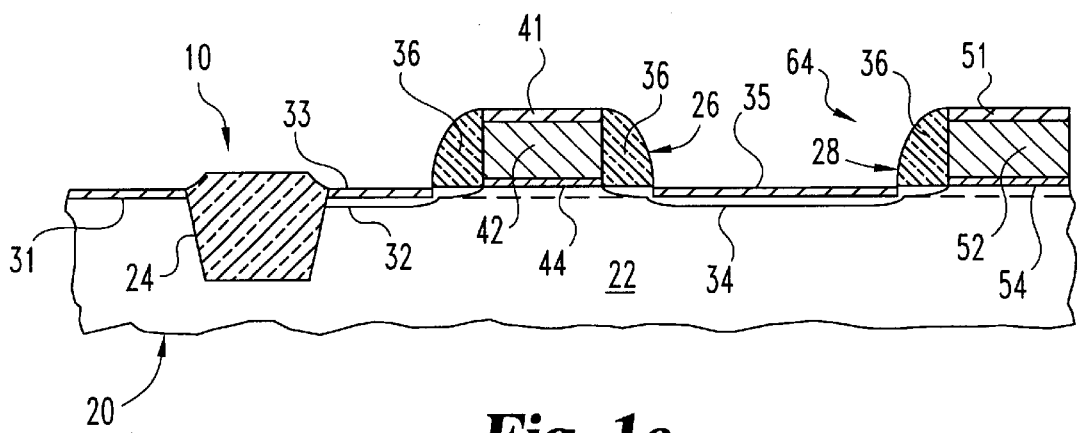

FIG. 1c represents IC 20 after layer 62 has been removed. Typically, layer 62 is stripped by utilizing an etch process suitable to its composition. FIG. 1c also depicts intergate gap 64 between gates 26 and 28.

For one process of the present invention corresponding to FIGS. 1b and 1c, layer 62 represents a Ti blanket deposited with a thickness between 20 and 40 nanometers. A first RTA is performed at 720 degrees celsius for 30 seconds to create corresponding silicide layer 31 generally having a C49-TiSi$_2$ crystal structure. The unreacted Ti layer is then stripped using a wet etch in correspondence with FIG. 1c.

Figure 1D:
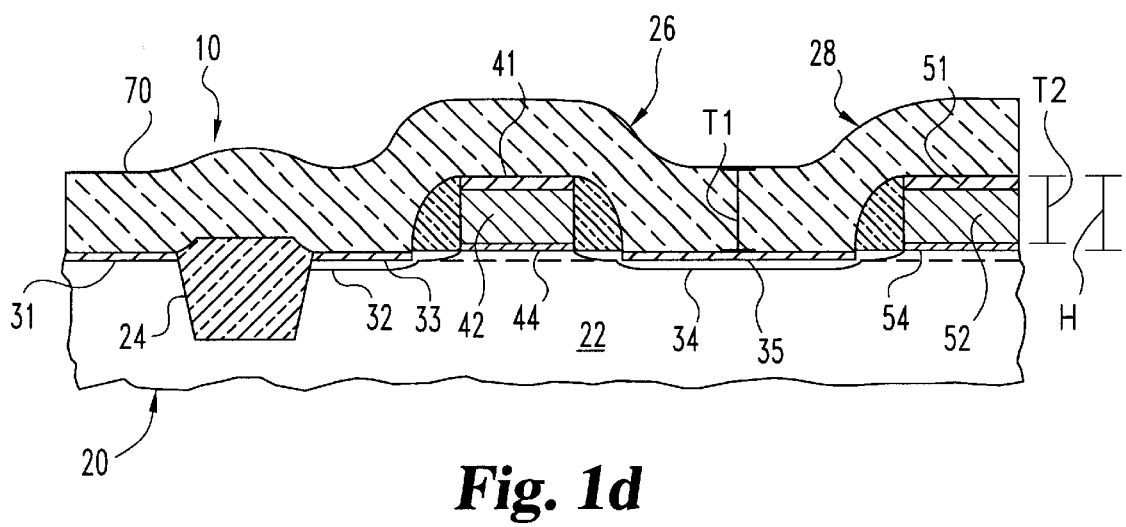

IC 20 is further processed in accordance with the present invention by coating IC 20 with an insulative or dielectric layer 70 as shown in FIG. 1d. Layer 70 fills intergate gap 64, and is preferably formed from an oxide or a nitride of silicon. Layer 70 is preferably formed with a uniform thickness T1 greater than the maximum height H of gates 26 and 28 as they project from substrate 22. Furthermore, thickness T1 is generally greater than the collective maximum thickness T2 of polysilicon strips 42, 52 and silicide layers 41, 51, respectively. Layer 70 has a point closest to substrate 22 that is still above gates 40 and 50. In one preferred embodiment, layer 70 is an oxide of silicon formed by a high-density plasma deposition procedure.

Figure 1E:
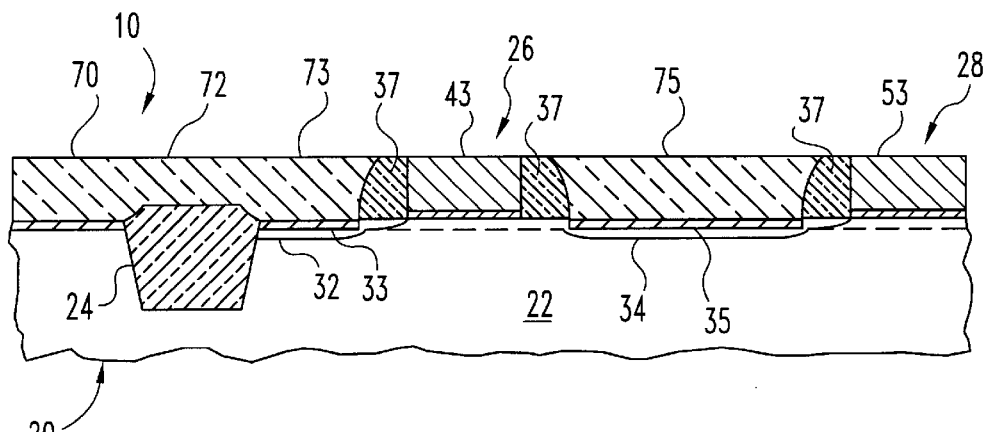

As shown in FIG. 1e, a portion of layer 70 is removed to expose generally planar polysilicon surfaces 43 and 53 of gates 26 and 28, respectively, without exposing silicide regions 33 and 35. Also removed are silicide regions 41 and 51 and a portion of spacers 36 to form shortened spacers 37. Notably, for this embodiment, the removal process planarizes IC 20; defining a generally planar surface 72 of layer 70 that is substantially coplanar with polysilicon surfaces 43, 53. Also, layer 70 is intermittently spaced along substrate 22 as a result of this planarization. Notably planarized portion 73 of layer 70 covers silicide region 33 and planarized portion 75 of layer 70 covers silicide region 35. Preferably, planarization is accomplished by a conventional Chemical-Mechanical Polishing (CMP) technique suitable for the composition of layer 70.

Figure 1F:
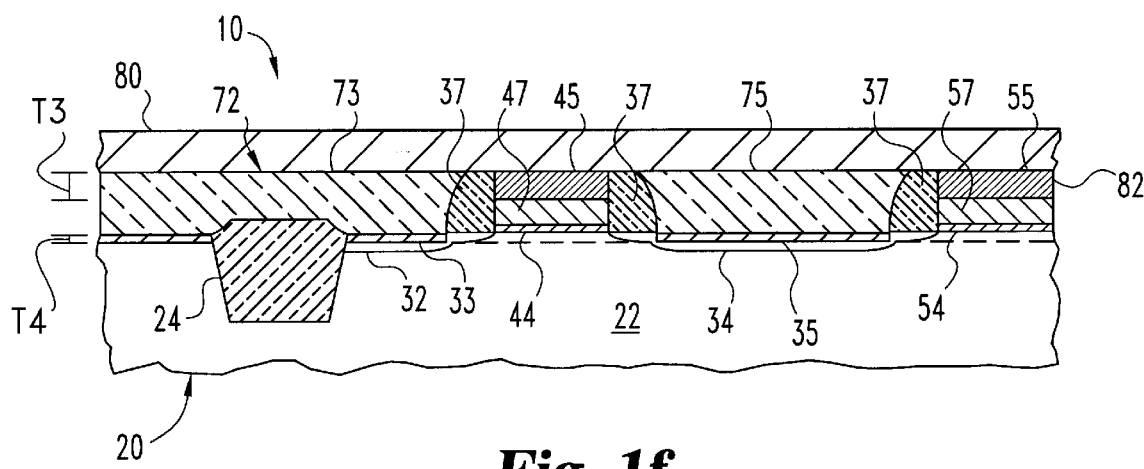

A second metallic layer 80 blankets surface 72 in FIG. 1f and is deposited to be substantially planar and parallel to surface 72. Layer 80 contacts surfaces 43 and 53 of gates 26 and 28, respectively, and portions 73 and 75. Portions 73 and 75 prevent contact with silicide regions 33 and 35. As a result, self-aligned silicidation of gates 26, 28 may be performed independently of the silicidation of source-region 32 and drain region 34. Shortened spacers 37 likewise shield substrate 22 from contact with metallic layer 80.

FIG. 1f reflects the formation of intermittent silicide layer 82 having gate silicide regions 45, 55 corresponding to gates 26, 28. Layer 82 is formed by a second RTA which provides silicide regions 45, 55 on polysilicon strip portions 47, 57, respectively. Notably, the parameters of silicide layer 82 formation, and corresponding gate silicide regions 45, 55, may be controlled independently of the silicide formation of silicide regions 33, 35. Preferably, thickness T3 of silicide regions 45, 55 is greater than thickness T4 of silicide regions 33, 35. After the second RTA, layer 80 is stripped by an etch suitable for the composition of layer 80. After removal of layer 80, a third RTA may be performed as required to complete silicide formation. In the case of a TiSi$_2$ silicide, the third RTA lowers sheet resistance by changing the silicide crystal structure to a C54-TiSi$_2$ phase. It should be understood that IC 20 preferably includes a large number of other transistor structures each having gates spaced apart from one another to define corresponding intergate gaps therebetween. These transistors may be simultaneously processed in accordance with the present invention to provide gate silicide with a thickness greater than silicide on corresponding source and drain regions.

In one preferred embodiment, metallic layer 80 is primarily composed of elemental Ti with a thickness of about 55 nm. The second RTA applied to layer 80 is performed at about 720 degrees celsius for about 30 seconds. The unreacted Ti corresponding to layer 80 is stripped by a wet etch and a third RTA is performed to change the crystalline structure of silicide regions 33, 35, 45, and 55 to lower sheet resistance. This third RTA is performed at about 850 degrees Celsius for about 30 seconds.

Formation of transistors 26, 28, and IC 20 is completed after silicide formation of gates 26, 28 using techniques known to those skilled in the art. In one embodiment, after formation of the silicide is complete, a premetal dielectric such as an intermetal oxide (IMO) is deposited on integrated circuit 20. Contact holes are formed in the premetal dielectric using conventional techniques and contact metal is deposited as needed to interconnect various devices of IC 20.

Figure 2:
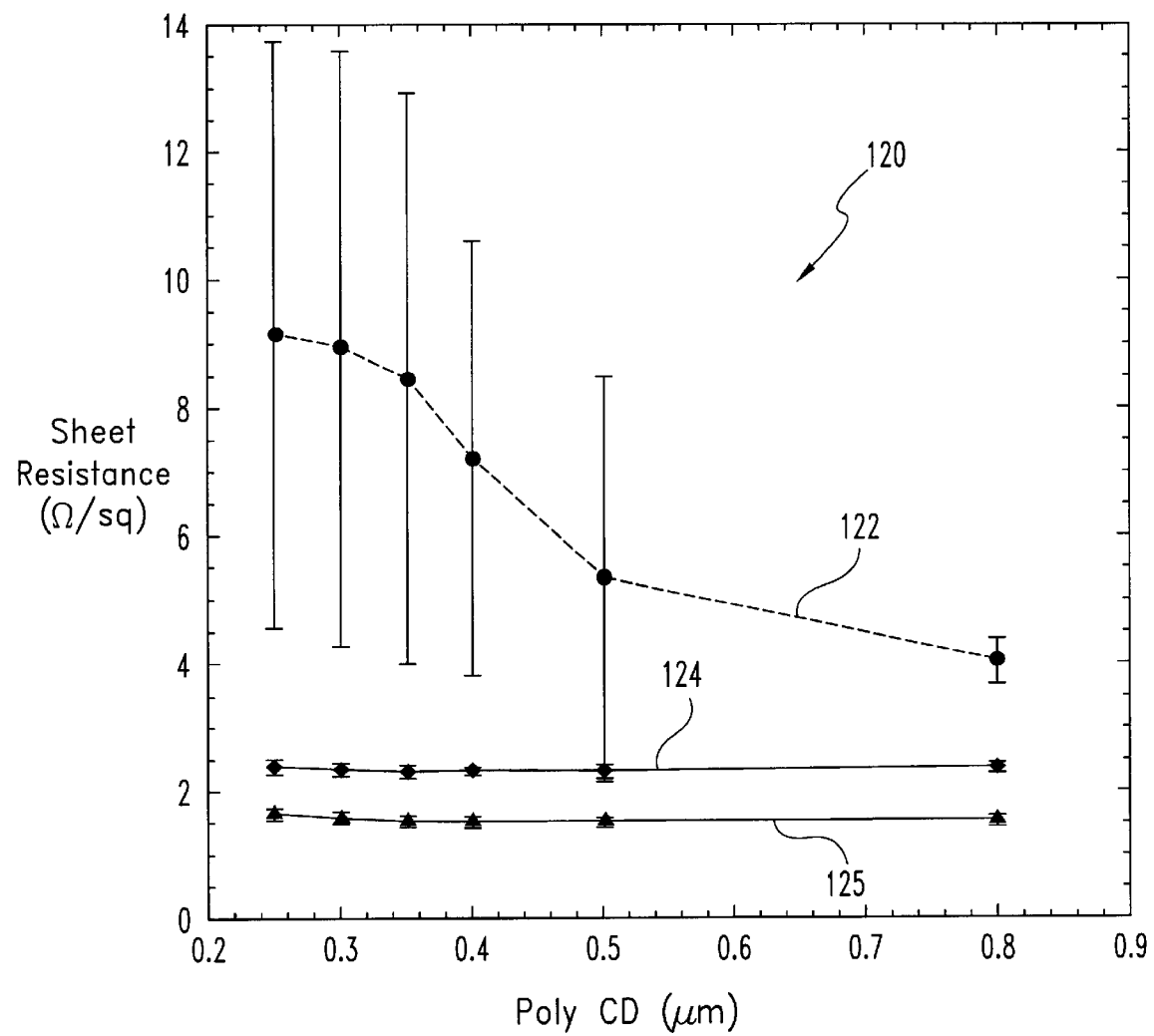
FIG. 2 is a graphic illustration of certain results achieved with the process of FIGS. 1a–1f.

The multiple self-aligned silicidation stages reflected in FIGS. 1a–1f provide for a different thickness of the gate silicide relative to the source/drain silicide; thus facilitating the continued reduction of junction dimensions without suffering from high sheet resistance at the gate. FIG. 2 provides graph 120 depicting selected performance aspects of various n+ polysilicon gates formed in accordance with process 10. Graph 120 compares differently sized gates in terms of critical dimension ("Poly CD") in microns (horizontal axis) to silicide sheet resistance (vertical axis) for different thickness of a Ti metallic layer corresponding to layer 80. Plots 122, 124, 125 of FIG. 2 correspond to Ti thicknesses for layer 80 of 350 Angstroms, 500 Angstroms, and 700 Angstroms, respectively; and have corresponding circular, diamond, and triangular shaped plot points. The vertical line segment through each plot point is representative of standard deviation of the plot. The greater the length of the vertical line segment through a given plot point, the greater the standard deviation.

For plot 122, it can be seen that the narrow line sheet resistance and the standard deviation increase rapidly with decreasing polysilicon line width. In contrast, for plot 124, the sheet resistance remains nearly constant at about 2.2 Ω/sq. and the standard deviation is very small. A further increase in Ti thickness reduces sheet resistance to about 2.0 Ω/sq for the narrowest gate indicated. Thus, the increased gate silicide thickness achieved through self-aligned formation in accordance with the present invention facilitates the reduction of device features.

In addition, by decoupling the gate silicide formation from the source/drain silicide, process controls may typically be relaxed for the silicide formation with layer 62 because the more critical gate silicide is independently formed with layer 80. Another benefit of decoupling is that cleaning processes for the polysilicon portion of the gate need not be as stringent. Furthermore, because a Chemical-Mechanical Polishing (CMP) procedure is performed as part of process 10, CMP leveling typically need not be performed for a subsequently formed Intermetal Oxide (IMO) layer because it is already generally planar by virtue of deposition on surface 72.

A second self-aligned silicidation process 210 of another embodiment of the present invention is described in connection with FIGS. 3a–3f. FIGS. 3a–3f progressively illustrate certain stages of process 210. Among the advantages of process 210 is that it generally overcomes the limitations encountered when using SiON Bottom Antireflective Coating (BARC) to improve photolithographic definition of gate regions at the same time self-aligned silicidation is also desired.

Figure 3A:
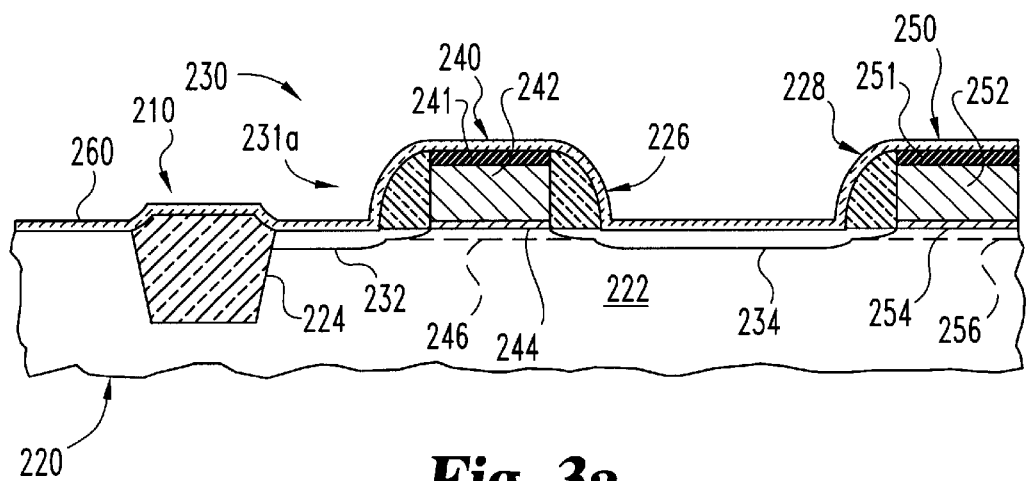
FIGS. 3a–3f are partial cross-sectional views of a semiconductor device at certain progressive stages of a second self-aligned silicidation process of the present invention.

FIG. 3a depicts semiconductor device 220 having silicon substrate 222 at an intermediate processing stage. Semiconductor device 220 includes region 230 with semiconductor device features 231a projecting above substrate 222. Substrate 222 is generally planar and preferably extends along a plane substantially perpendicular to the view plane of FIGS. 3a–3f. Device 20 includes isolation trench 224 and transistors 226, 228, where only a portion of transistor 228 is depicted. It should be understood that transistors 226, 228 are depicted at an intermediate stage of manufacture. Transistor 226 has source 232 and drain 234. Drain 234 is shared with transistor 228.

Transistor 226, 228 has corresponding gate structure 240, 250 extending from substrate 222 along a direction generally perpendicular to the plane along which substrate 222 extends. Gate structure 240, 250 has a polysilicon layer member 242, 252, capped with a Bottom Antireflective Coating (BARC) layer 241, 251, respectively. Preferably, BARC layers 241, 251 are formed from SiON. The polysilicon gate member 242, 252 of each gate structure 240, 250 rests on a gate oxide pad 244, 254, respectively. Gate structures 240, 250 each have a corresponding channel region 246, 256. An implant screen oxide layer 260 coats device 220 in the component region. Transistors 226, 228 may be made using frontend processes similar to that described in connection with transistors 26, 28 of FIG. 1a, except transistors 226, 228 include corresponding BARC layers 241, 251 to enhance photolithographic definition during gate patterning.

Figure 3B:
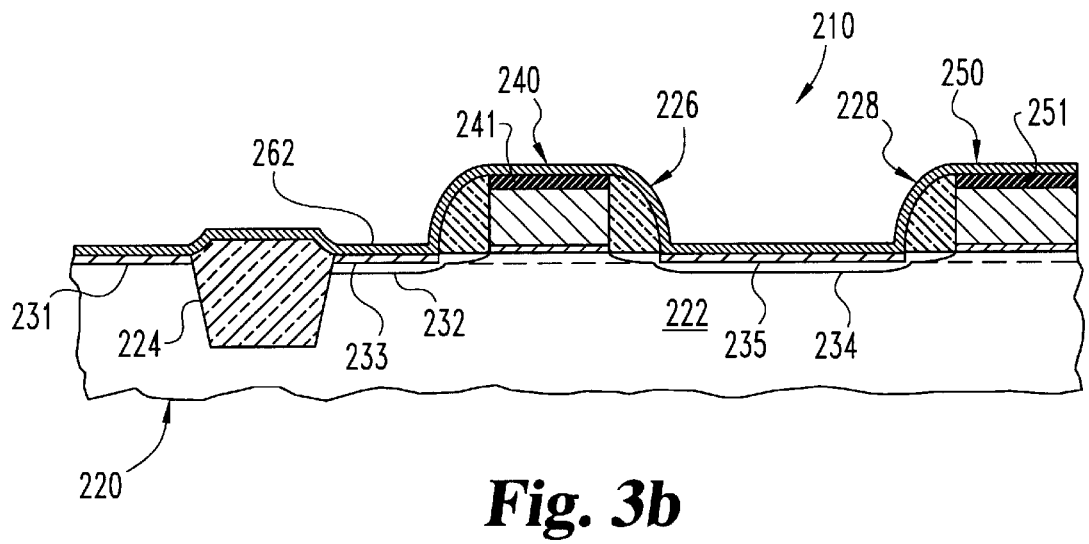

In FIG. 3b, oxide layer 260 has been stripped and metallic layer 262 has been deposited. Metallic layer 262 is composed of a material suitable to provide for silicidation of source 232 and drain 234. Preferably, metallic layer 262 is formed from elemental Ti, Co, or Ni. A first RTA is performed to provide an intermittent silicide layer 231 corresponding to portions of device 220 where silicon was in contact with metallic layer 262. Silicide layer 231 includes source silicide region 233 and drain silicide region 235 for drain 234. This structure is comparable to silicide regions 33, 35 of integrated circuit 20; however, BARC layers 241, 251 prevent formation of silicide from polysilicon members 242, 252, respectively.

Figure 3C:
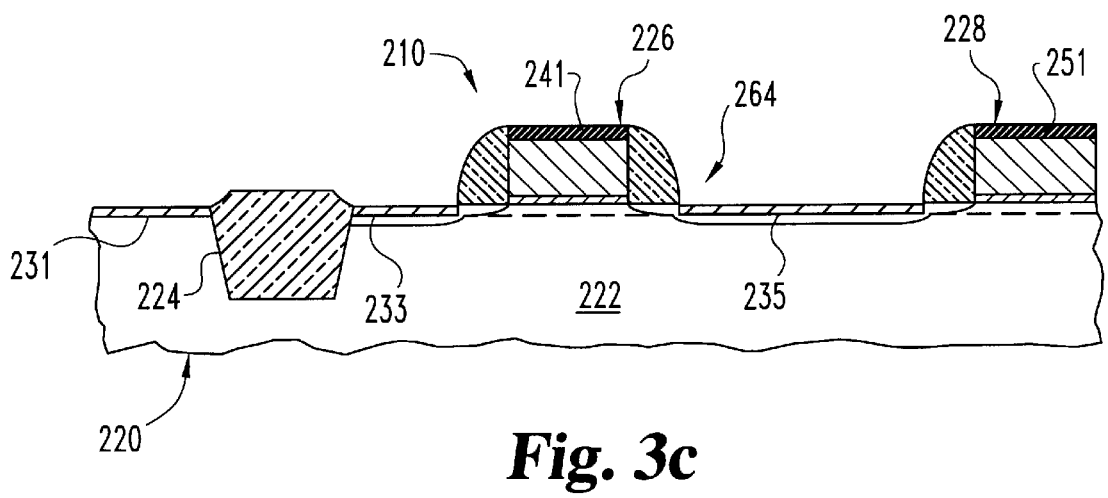
Figure 3D:
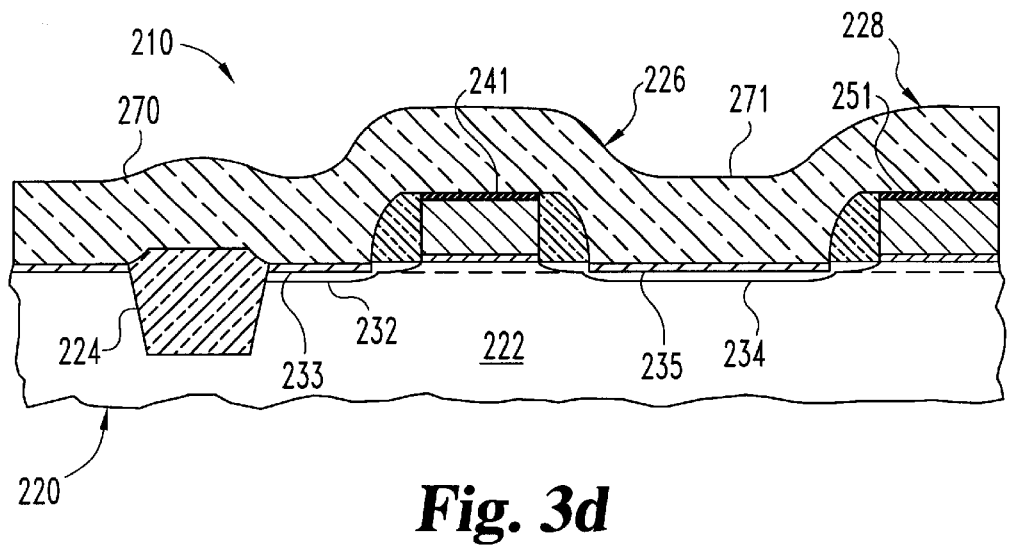

After the first RTA, metallic layer 262 is removed by conventional means, such as a wet etch resulting in the arrangement represented by FIG. 3c. FIG. 3c indicates an intergate gap 264. As illustrated in FIG. 3d, a dielectric coating 270, such as silicon dioxide, is deposited. Dielectric coating 270 at least partially fills gap 264 and coats gate structures 240, 250.

Figure 3E:
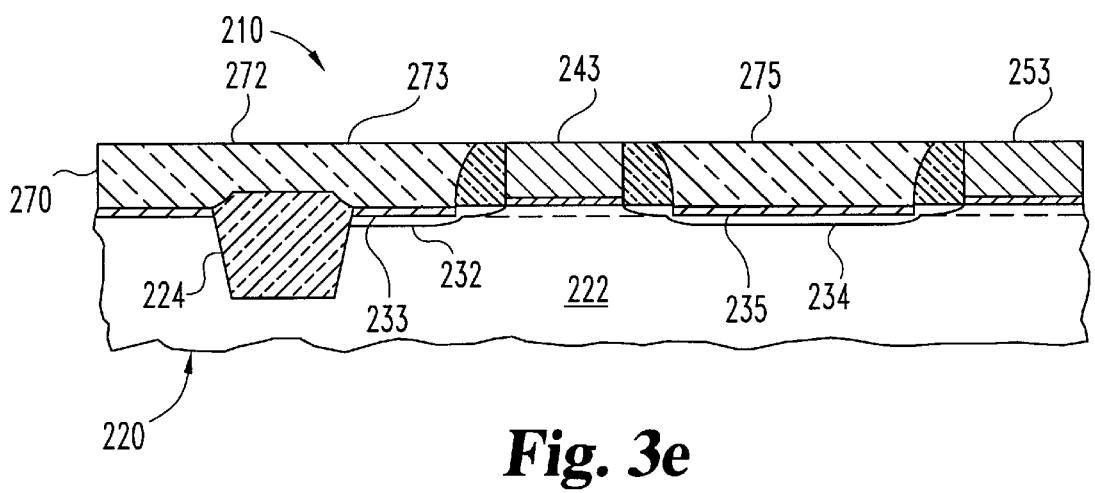

In FIG. 3e, parts of coating 270 farthest away from substrate 222 are removed. Removal of the part of device 220 farthest away from substrate 222 also occurs, including the removal of BARC layers 241, 251, until a generally planar surface 272 is formed. It should be appreciated that this removal process may be accomplished by a standard CMP process appropriate for the composition of coating 270. The partial removal of coating 270 exposes polysilicon surface 243, 253 of corresponding gate structures 240, 250 without exposing silicide regions 233 or 235. Instead, the removal process results in an intermittent fill pattern of dielectric coating 270 that provides coating portion 273 over silicide region 233 and coating portion 275 over silicide region 235.

Figure 3F:
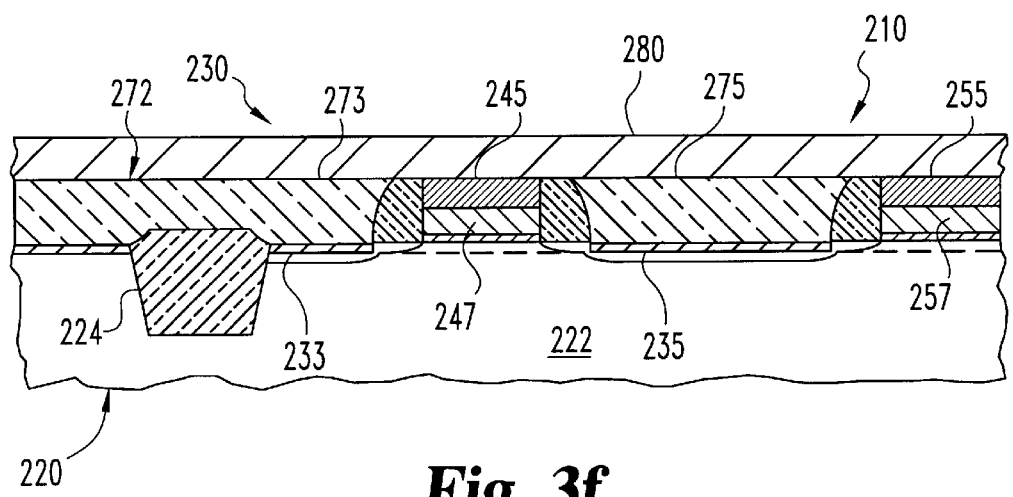

FIG. 3f shows a second metallic layer 280 deposited on surface 272. Device 220 is subjected to a second RTA to form gate silicide regions 245, 255 for gate structures 240, 250, respectively. The silicidation process consumes a part of polysilicon members 242, 252 leaving corresponding polysilicon layers 247, 257. As in the case of the first self-aligned silicidation technique of FIGS. 1a–1f, the technique of FIGS. 3a–3f also decouples the self-aligned silicidation of gate structures 240, 250 from the silicidation of active source/drain areas to facilitate formation of a silicide layer on gate structures 240, 250 of a different thickness. Preferably, the thickness of silicide regions 245, 255 is greater than silicide regions 233, 235 as illustrated in FIG. 3f.

After silicidation of gate structures 240, 250, a third RTA may be performed to improve performance and the formation of transistors 226, 228 is completed as described in connection with transistors 26, 28. Notably, the performance characteristics described in connection with FIG. 2 also apply to device 220 of FIGS. 3a–3f.

Figure 4A:
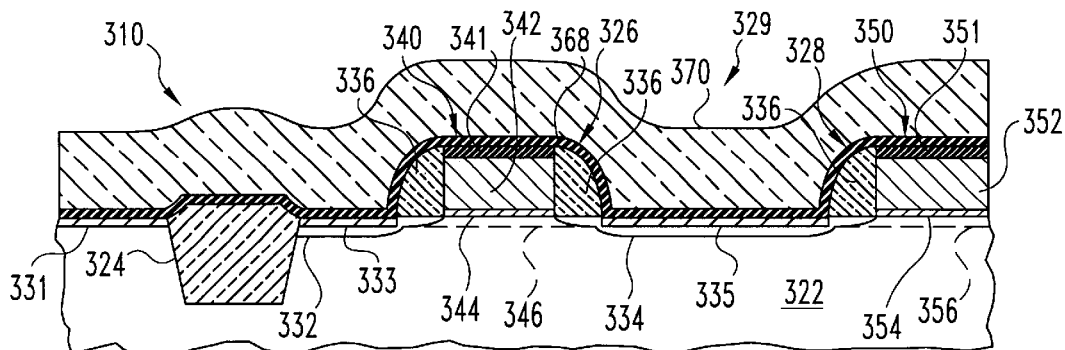
FIGS. 4a–4h are partial cross-sectional views a semiconductor device at certain progressive stages of a simultaneous gate electrode and interconnect formation process of the present invention.

FIGS. 4a–4h progressively illustrate certain stages of simultaneous gate electrode and interconnect formation process 310 of another embodiment of the present invention. One advantage of process 310 is the provision of local interconnections useful in the manufacture of high density Random Access Memory (RAM). FIG. 4a illustrates an intermediate state of integrated circuit semiconductor device 320 of the present invention. Device 320 has silicon substrate 322 with an isolation structure 324 formed as a shallow isolation trench using conventional techniques and transistors 326 and 328, where transistor 328 is only partially shown. Transistors 326, 328 are among features 329 of device 320 projecting from substrate 322 along a direction substantially perpendicular to a plane along which substrate 322 generally extends. Preferably, the plane of substrate 322 is generally perpendicular to the view plane of FIGS. 4a–4h. A drain connection region 331 for another transistor (not shown) of device 320 is formed with a silicided surface along substrate 322. Drain connection region 331 is formed on a side of the trench opposite transistors 326, 328. Transistor 326 includes a source 332 with source connection region 333 having a silicided surface along substrate 322 and common drain 334 with drain connection region 335 having a silicided surface along substrate 322. Transistor 328 shares common drain 334 with transistor 326.

Transistors 326, 328 have gates 340, 350 formed on substrate 322 in the manner generally described in connection with gate structures 240, 250 of corresponding transistors 226, 228. Gates 340, 350 have BARC layers 341, 351 capping polysilicon strips 342, 352, respectively. Strips 342, 352 are formed on gate oxide pads 344, 354 in the usual manner to define corresponding channel regions 346, 356. Gates 340, 350 are bounded by spacers 336. Spacers 336 are preferably formed from an oxide or nitride of silicon. The structure of device 320 described thus far may be formed in the manner described in connection with device 220 of FIGS. 3a–3f.

Trench 324, connection regions 331, 333, 335, and gates 340, 350, are coated by a barrier 368. Preferably, barrier 368 is formed from silicon nitride. Coating 370 is. formed from an oxide of silicon and blankets device 320, covering barrier 368. The structure of device 320 is essentially the same as that presented in FIG. 3c absent barrier 368 and coating 370.

Figure 4B:
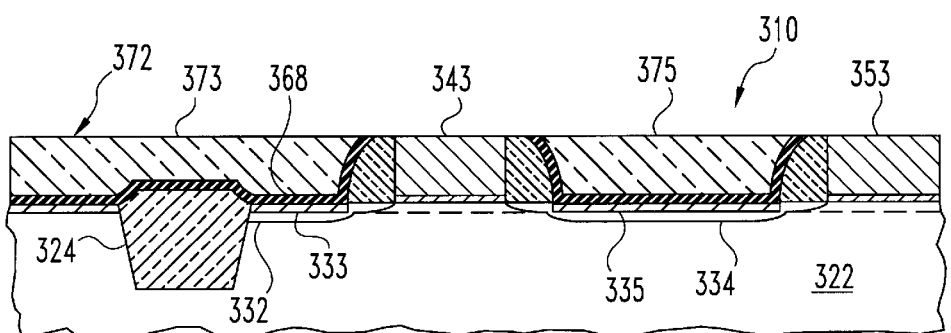

In FIG. 4b, a CMP process is performed to remove a portion of coating 370, barrier 368, and gates 340, 350 resulting in generally planar surface 372. As device 320 is leveled by CMP, parts of barrier layer 368 and coating 370 are removed, resulting in a broken appearance, such that polysilicon surfaces 343, 353 of corresponding gates 340, 350 are exposed. Polysilicon surfaces 343, 353 are generally coplanar with surface 372 at the stage represented by FIG. 4b. Source connection region 333 and drain connection region 335 remain covered by parts of barrier 368 and parts 373, 375 of coating 370, respectively.

Figure 4C:
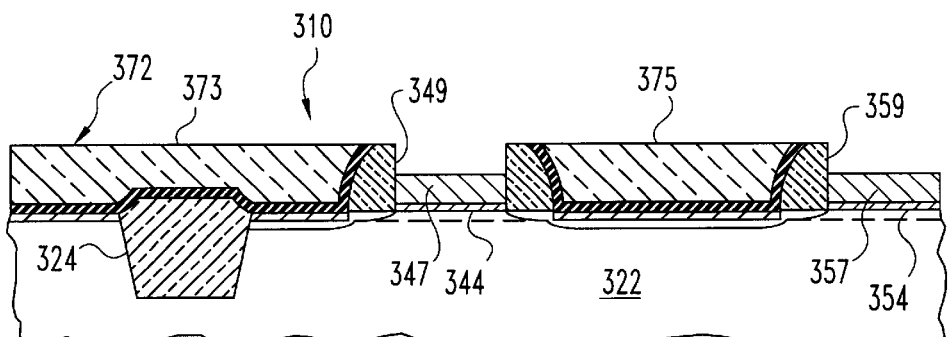

In FIG. 4c, a polysilicon selective etch-back is performed to form recesses 349, 359, respectively. This etch-back is controlled to leave a polysilicon layer 347, 357 on a corresponding oxide pad 344, 354. In one preferred embodiment, the etch-back chemistry includes chlorine gas and Hydrogen Bromide (HBr) at a temperature of about 60 degrees Celsius; however, other etching chemistries or removal techniques may be employed as would occur to those skilled in the art.

Figure 4D:
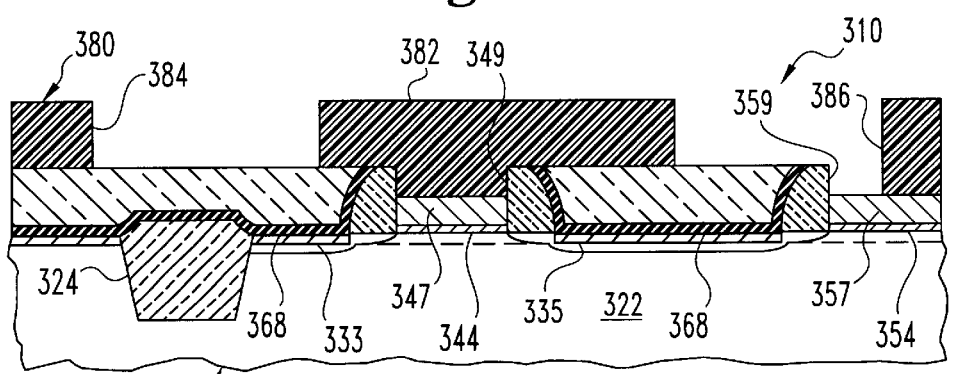

After a controlled etch-back of gates 340, 350; pattern 380 of photoresist 382 is provided on device 320 as illustrated in FIG. 4d using conventional lithography techniques. Pattern 380 defines openings 384 and 386 for subsequent processing. Notably, photoresist 382 fills recess 349, but only partially occupies recess 359.

Figure 4E:
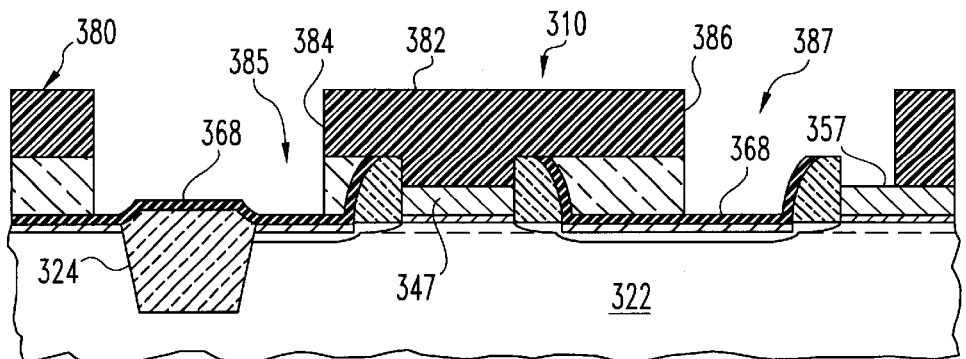

FIG. 4e illustrates the formation of trenches 385, 387 in correspondence with openings 384, 386. Trenches 385, 387 are provided by etching portions of coating 370 exposed to openings 384, 386. This etch of coating 370 is selective to barrier 368. Besides stopping at barrier 368, the removal of coating 370 does not appreciably affect polysilicon layer 357.

Figure 4F:
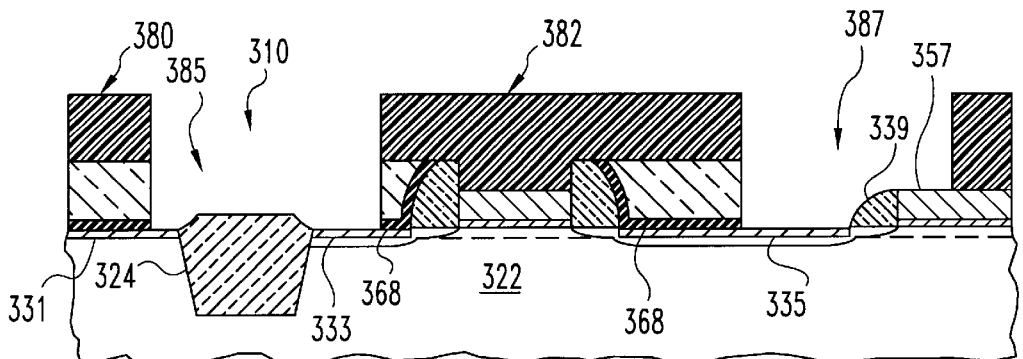

As reflected in FIG. 4f, a second removal step is performed to remove parts of barrier 368 at the bottom of trenches 385, 387 and to remove a portion of the spacer adjacent polysilicon layer 357 to become generally level therewith, which is designated as recessed spacer 339. Upon removal of portions of barrier 368, drain connection region 331 and source connection region 333 become exposed in trench 385, and drain connection region 335 and polysilicon layer 357 become exposed in trench 387. Notably, drain connection region 331 and source connection region 333 are electrically isolated from each other by isolation structure 324 at the stage illustrated by FIG. 4f.

Figure 4G:
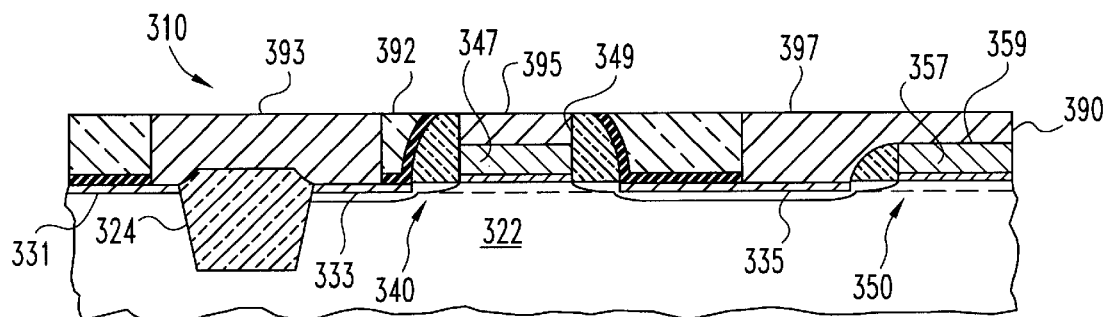

In FIG. 4g, the photoresist 382 is removed and a metallic local interconnect layer 390, preferably tungsten (W), is deposited to fill recesses 349, 359 and trenches 385, 387. Interconnect layer 390 is planarized, preferably by a suitable CMP process or etch-back technique to provide the generally planar surface 392 with various metallic fill regions that are electrically conductive. One region provides local interconnect 393 between drain connection region 331 and source connection region 333, bridging isolation structure 324. Another region provides metal electrode 395 for gate 340. Region 397 defines and integrally connects a metal electrode for gate 350 to drain connection region 335. It should be appreciated that process 310 provides an intermittent local conductive interconnection layer without routing through or on an insulative layer.

Figure 4H:
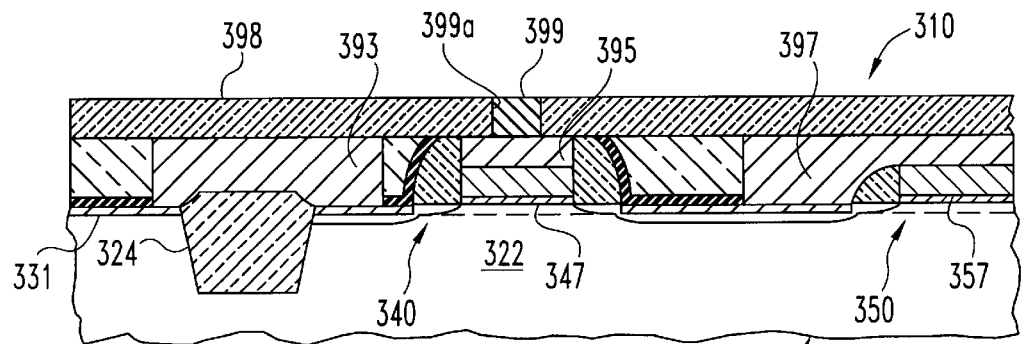

FIG. 4h depicts an intermetal oxide (IMO) layer 398 deposited on surface 392. A metallic contact via hole 399a with a metal plug 399 is also shown to provide electrical contact with electrode 395. In one embodiment of the present invention, multiple metal contact vias are formed through IMO layer 398 to provide interconnections between remotely located contact sites of device 320, however, layer 390 is utilized to provide desired electrical connections between components that are close or local to each other. For example, remote connections may be defined by patterning a metal layer on the top side of IMO layer 398 to provide desired routing from plug 399 to other metal contact vias of layer 398 (not shown) using techniques known to those skilled in the art. Completion of device 320 may be performed from the stage reflected in FIG. 4h in a conventional manner.

The simultaneous and selective formation of gate electrodes and local interconnections facilitates the development of high density devices such as RAM. Furthermore, this metallization technique may be applied to a variety of semiconductors device types and arrangements, reducing the need for gate to source/drain interconnects through an upper insulative or dielectric layer by contact metal.

In one preferred embodiment, a thin film resist having a thickness no greater than about 2000 Angstroms is utilized as resist 382 of photoresist pattern 380. This thin resist architecture permits process 310 to approach the actual wavelength limitations of the lithography in defining the contact feature size resolution instead of the grosser limitations typically imposed by resist thickness-limited lithography. In one aspect of this embodiment, device features as small as 0.25 $\mu$m can be defined and etched. In another aspect of process 310, the metallic layer 390 may be added without significantly increasing cost or complexity.

As advances toward smaller semiconductor device features have been made, the acceptability of electrical contact misalignments resulting from the limitations of lithography techniques has commensurately increased. Proper function of semiconductor devices depends on the ability to prevent unwanted electrical interconnections that result from such misalignments. Certain etch-stop arrangements are useful in preventing such unwanted electrical connections. FIGS. 5a–5f progressively illustrate certain stages of self-aligned etch-stop layer formation process 410 of another embodiment of the present invention.

Figure 5A:
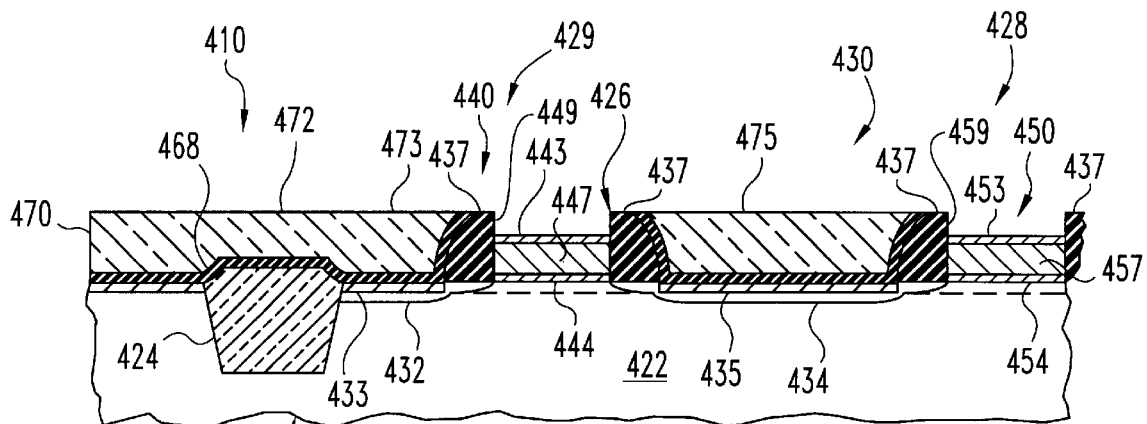
FIGS. 5a–5f are partial cross-sectional views a semiconductor device at certain progressive stages of a self-aligned etch stop layer formation process of the present invention.

In FIG. 5a, integrated circuit semiconductor device 420 is illustrated in an intermediate stage of processing. Device 420 has a generally planar silicon substrate 422 of a conventional type, such as silicon. Substrate 422 is generally planar and preferably extends along a plane substantially perpendicular to the view plane of FIGS. 5a–5f. Device 420 has an isolation structure 424 formed using conventional techniques. Device 420 includes device region 430 with a number of semiconductor components 429 such as transistor structures 426, 428, where only a portion of transistor structure 428 is illustrated. Notably, transistor structures 426, 428 are illustrated in an intermediate stage of manufacture also.

Transistor structure 426 has a source region 432 with connection region 433 having a silicided surface along substrate 422 and a common drain 434 with connection region 435 having a silicided surface along substrate 422. Transistor structure 428 shares common drain 434. Transistor structures 426, 428 each have a gate structure 440, 450 respectively. Gate structures 440, 450 have corresponding metallization layers 443, 453 and gate oxide pads 444, 454. Polysilicon gate members 447, 457 of each gate structure 440, 450 are positioned between metallization layers 443, 453 and pads 444, 454, respectively. Each gate structure 440, 450 defines a corresponding recess 449, 459 above metallization layers 443, 453. Each gate structure 440, 450 is bounded by spacers 437. Spacers 437 are preferably made of a material that is etched along with either oxide or nitride, but not both as will become apparent from the following description. In one preferred embodiment, spacers 437 are formed from either silicon nitride or silicon dioxide.

Intermittent nitride barrier 468 covers trench 424, connection regions 433, 435, and spacers 437. An intermittent oxide layer 470 covers barrier 468 and fills the uneven contours defined by trench 424, and gate structures 440, 450 to define a generally planar surface 472 which is approximately parallel to substrate 422. Layer 470 has layer part 473 covering source 432 and connection region 433, and layer part. 475 covering drain 434 and connection region 435.

The frontend formation of source 432, drain 434, and gate structures 340, 350 on substrate 422 may be in accordance with the procedures described in connection with FIGS. 1a or 3a. In one embodiment of process 410, device 420 of FIG. 5a is provided by first performing the processing stages corresponding to FIGS. 4a–4c of process 310, and then selectively growing metallization layers 443, 453 from an elemental metal or metallic alloy. For example, a selective Chemical Vapor Deposition (CVD) procedure may be utilized to grow a thin Tungsten (W) in the bottom of corresponding recesses 449, 459. Alternatively, metallization layers 443, 453 may be formed by a self-aligned silicidation technique after processing in accordance with process 310 through the FIG. 4c stage. For the silicidation approach, metallization layers may be composed of $TiSi_2$ corresponding to a Ti metal silicidation. In other embodiments, different frontend processing of device 420 may be employed as would occur to those skilled in the art to provide the described structure of FIG. 5a.

Figure 5B:
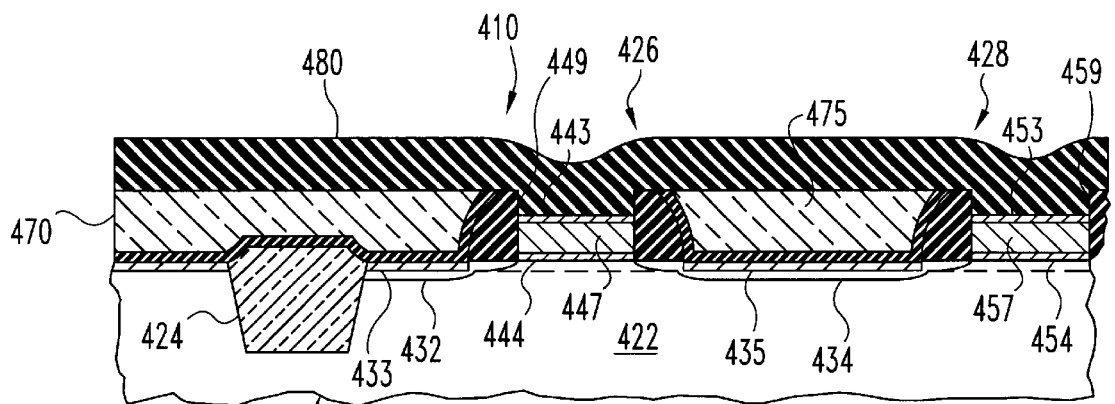

FIG. 5b illustrates the deposition of a blanket layer 480 of silicon nitride. Layer 480 fills recesses 449, 459, covering metallization layers 443, 453, barrier 468, and layer 470 where exposed. Notably, connection regions 433, 435 are not contacted by layer 480, remaining covered by barrier 468 and layer parts 473, 475, respectively.

Figure 5C:
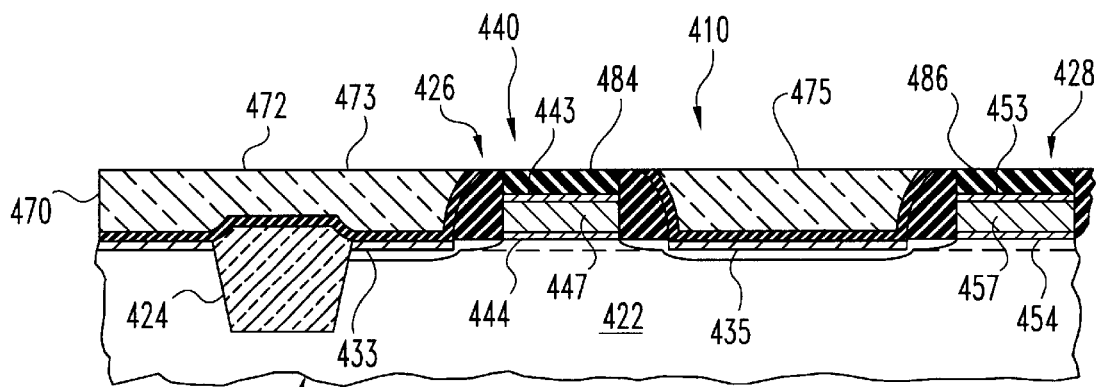

FIG. 5c illustrates device 420 after removal of a portion of layer 480 by planarization. The planarization of layer 480 may be performed by a conventional CMP suitable for silicon nitride removal or by an etching process controlled to generally stop at the planar surface 472. As a result, silicon nitride layer members 484 and 486 correspondingly fill recesses 449 and 459 of gate structures 440, 450. In other embodiments, the planarization may result in a surface parallel to surface 472, but having a different amount of material removal than that shown in FIG. 5c. Notably, the thickness of members 484 and 486 may be controlled within a given range to provide a self-aligned etch stop as more fully described hereinafter. Furthermore, it should be understood that the formation of members 484 and 486 is a self-aligned process and generally does not interfere with gate metallization formation.

Figure 5D:
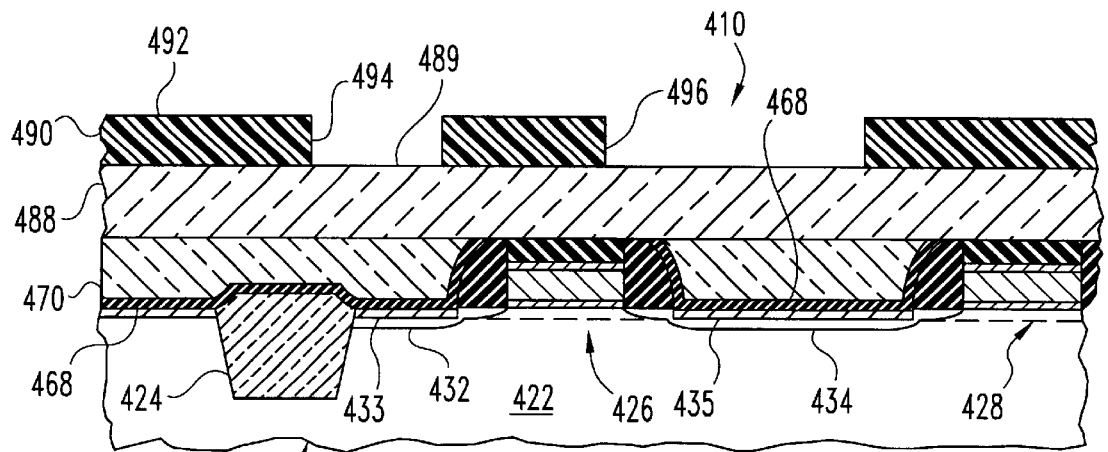

FIG. 5d illustrates the addition of a generally planar intermetal oxide layer 488 on surface 472. Layer 488 defines a generally planar surface 489 approximately parallel to surface 472 and substrate 422. Also, resist pattern 490 of resist material 492 is illustrated defining openings 494 and 496. Opening 494 is positioned over connection region 433 of source 432 and overlaps trench 424. Opening 496 is positioned over connection region 435 of drain 434 and overlaps gate structure 440. The position of openings 494 and 496 relative to corresponding connection regions 433 and 435 provides one representation of the type of misalignments that may be tolerated by process 410 when lithographically processing small geometry devices.

Figure 5E:
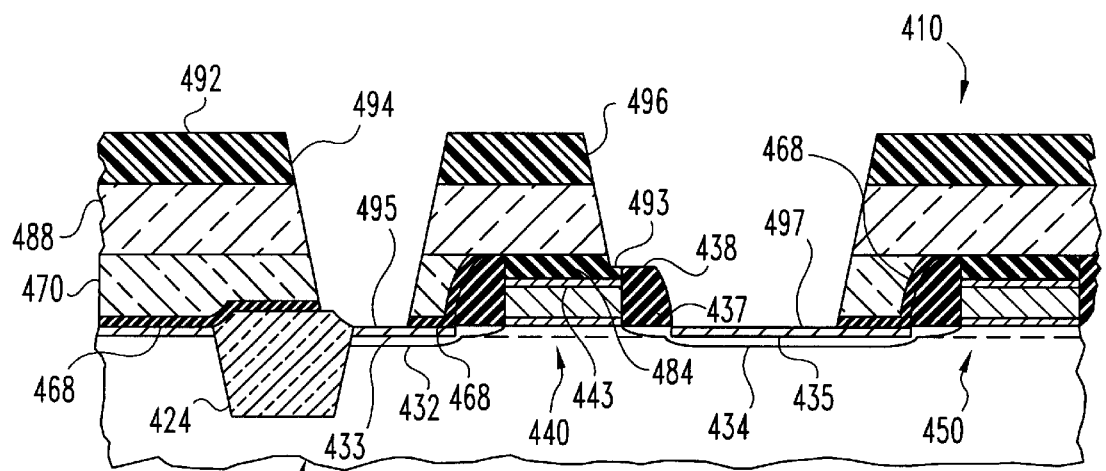

In FIG. 5e, trenches 495, 497 corresponding to openings 494, 496 are formed by first etching oxide layers 470, 488 selective to nitride barrier 468. In a second removal operation, nitride barrier 468 is etched selective to oxide. Notably, a portion of nitride layer member 484 is removed by the second etch as indicated at reference numeral 493. Also, a portion of spacer 437 in contact with member 484 is removed either by the first or second etch depending on its composition as indicated at reference numeral 438. In other embodiments, barrier 468 may be constructed so that spacers 437 are operatively covered thereby throughout the stages of process 410 corresponding to FIGS. 5a–5e.

Connection region 433 and a portion of the filler in trench 424 are exposed in the bottom of trench 495. Connection region 435 is exposed by formation of trench 497; however, the selected thickness of silicon nitride member 484 prevents the exposure of metallization layer 443 despite the misaligned nature of trench 497 (see reference numeral 493).

Figure 5F:
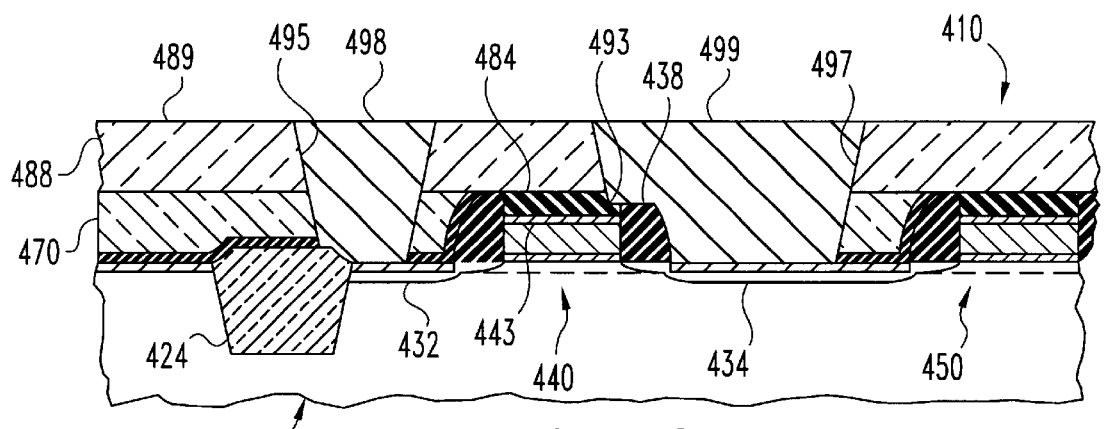

After trenches 495, 497 are formed, resist pattern 490 is removed. Next, as illustrated in FIG. 5f, trenches 495, 497 are filled with metallic layer members 498, 499, respectively. Metallic members 498, 499 provide an electrical connection with corresponding connection regions 433, 435 through layer 488, but do not inadvertently form a connection with metallization layer 443 of gate 440 despite the overlap of corresponding opening 496. By preventing the exposure of layer 443 during formation of trench 497 to reach connection region 435, the overlap of trench 497 caused by the misalignment of opening 496 relative to connection region 435 may be tolerated without adverse impact to the performance of device 420.

Members 498, 499 may be formed by depositing a layer of metal that fills trenches 495, 497 and covers layer 488, and then planarizing by an appropriate CMP procedure to reestablish generally planar surface 489 or another surface substantially coplanar or parallel thereto. In an alternative embodiment, the remainder of the metallic layer used to form members 498, 499 is removed by conventional etching. In still another embodiment, trenches 495, 497 are specifically formed to serve as contact holes.

As dimensions of field effect transistors decrease, maintaining the desired electrical performance from silicided polysilicon gates becomes more difficult. One alternative to silicidation is to replace at least a portion of the gate polysilicon member with an elemental metal or metallic alloy. Such materials substantially lower sheet resistance and generally eliminate the narrow-linewidth problems posed by some silicide techniques. Unfortunately, the substitution of part or all of a polysilicon gate with an elemental metal significantly complicates conventional semiconductor processing. For example, most suitable metals would be unacceptably degraded by the chemicals and high temperatures (as high as 1000° C.) encountered during the early stages of semiconductor device processing. In contrast, processes 510 and 610 correspond to additional embodiments of the present invention for providing self-aligned metallization of gates after high temperature processing is complete. Notably, the introduction of metal in processes 510 and 610 occurs at a stage of device fabrication that does not require exposure to high temperatures or harsh chemicals after the metal is provided in order to complete device formation.

FIGS. 6a–6e progressively illustrate semiconductor device 520 at certain stages of a first self-aligned metallization process 510 of the present invention. Device 520 has a generally planar silicon substrate 522 of a conventional type that preferably extends along a plane generally perpendicular to the view plane of FIGS. 6a–6e. Device 520 has isolation structure 524 formed using conventional techniques. Device 520 includes device region 530 with a number of semiconductor features 529 such as transistor structures 526, 528, where only a portion of transistor structure 528 is illustrated. Notably, transistor structures 526, 528 are also illustrated in an intermediate stage of manufacture.

Transistor structure 526 has a source 532 with a silicide layer 533 and a common drain 534 with a silicide layer 535. Transistor structure 528 shares common drain 534. Transistor structures 526, 528 each have a gate structure 540, 550, respectively. Gate structures 540, 550 have corresponding gate oxide pads 544, 554 and polysilicon gate members 542, 552 each capped by a BARC layer member 541, 551. Each gate structure 540, 550 is bounded by spacers 536 formed in a standard manner from a conventional material compatible with the stages described herein. Notably, in other embodiments of process 510, BARC layer members 541, 551 may not be utilized.

Nitride barrier 568 covers trench 524, silicide layers 533, 535, and spacers 536. Dielectric coating 570, preferably an oxide of silicon or nitride of silicon, covers barrier 568 and at least partially fills the uneven contours defined by isolation structure 524 to have a point closest to substrate 522 that is still above gate structures 540, 550. The frontend formation of source 532, drain 534, and gate structures 540, 550 on substrate 522 may be in accordance with process 210 described in connection with FIGS. 3a–3c, with the subsequent deposition of barrier 568 and dielectric coating 570. In other embodiments, different frontend processing of device 520 may be employed as would occur to those skilled in the art to provide the described structure of FIG. 6.

Figure 6A:
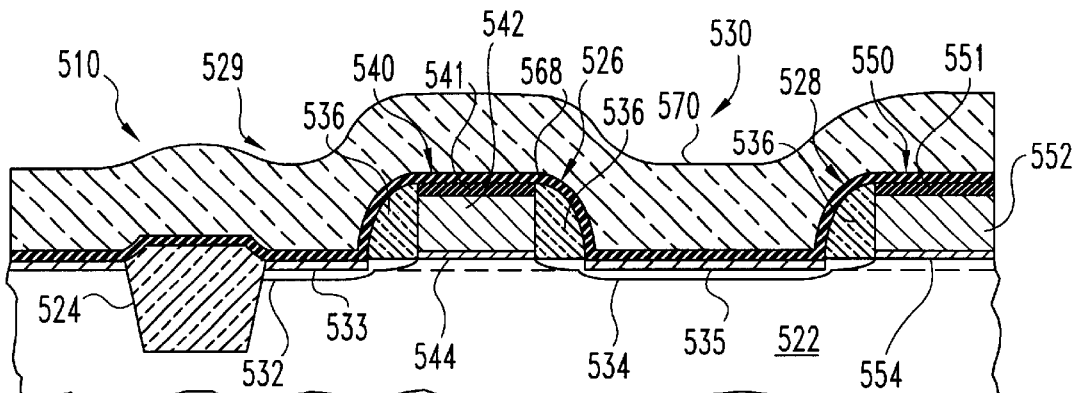
FIGS. 6a–6e are partial cross-sectional views a semiconductor device at certain progressive stages of a first self-aligned metallization process of the present invention.
Figure 6B:
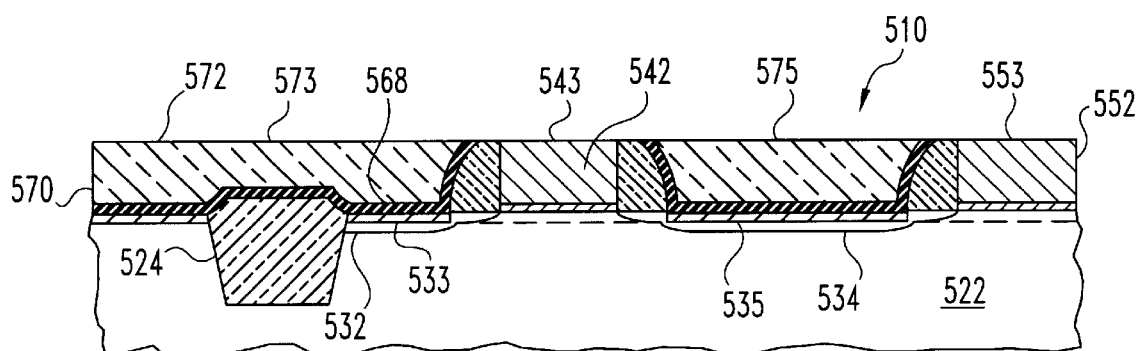

FIG. 6b illustrates the removal of a part of dielectric coating 570 to form substantially coplanar surfaces 543, 553 of corresponding gate structures 540, 550 that are generally coplanar with substantially planar surface 572 of coating 570. Surfaces 543, 553, 572 are approximately parallel to a plane along which substrate 522 preferably extends. The partial removal of dielectric coating 570 results in spaced apart layer members 573, 575.

Figure 6C:
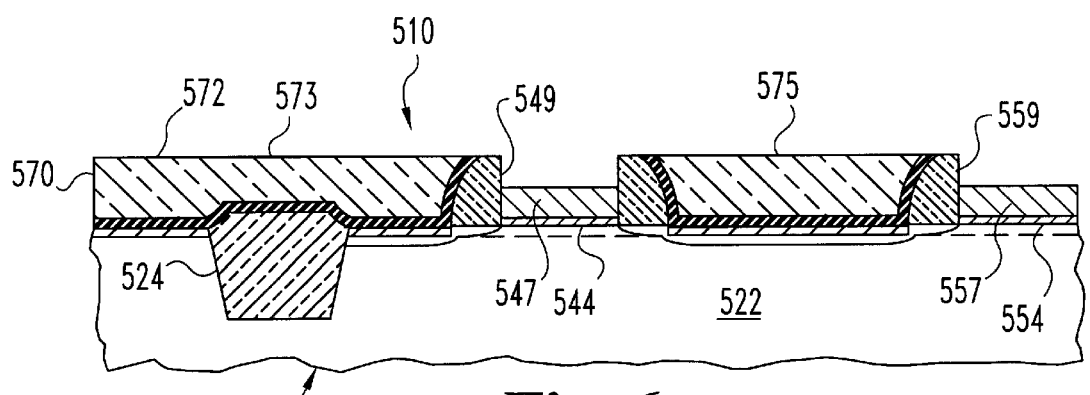

In FIG. 6c, the exposed polysilicon surfaces 543, 553 are selectively etched to define recesses 549, 559 relative to surface 572. After etching, polysilicon layers 547, 557 remain on oxide pads 544, 554, respectively. The etching chemistry for the polysilicon may be of a conventional type.

Figure 6D:
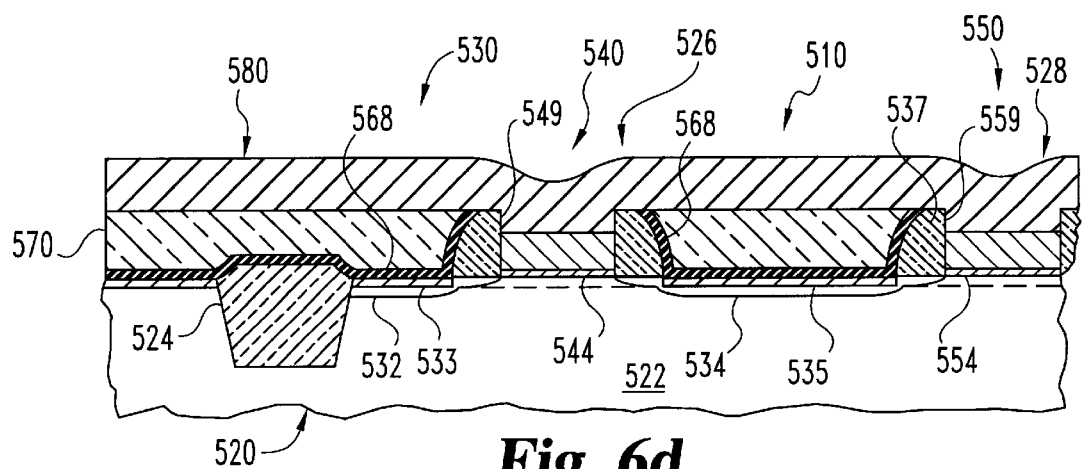

Referring to FIG. 6d, a metallic layer 580 has been deposited to fill recesses 549, 559 and cover surface 572. Preferably, metallic layer 580 is composed from Aluminum (AL), Tungsten (W), Copper (Cu), Silver (Ag), or Gold (Au), deposited by an appropriate conventional Chemical Vapor Deposition (CVD) or Physical Vapor Deposition (PVD) procedure. In a more preferred arrangement, a TiN adhesion layer is first deposited in recesses 549, 559; then a known CVD procedure is utilized to deposit W as the remainder of the metallic layer 580.

Figure 6E:
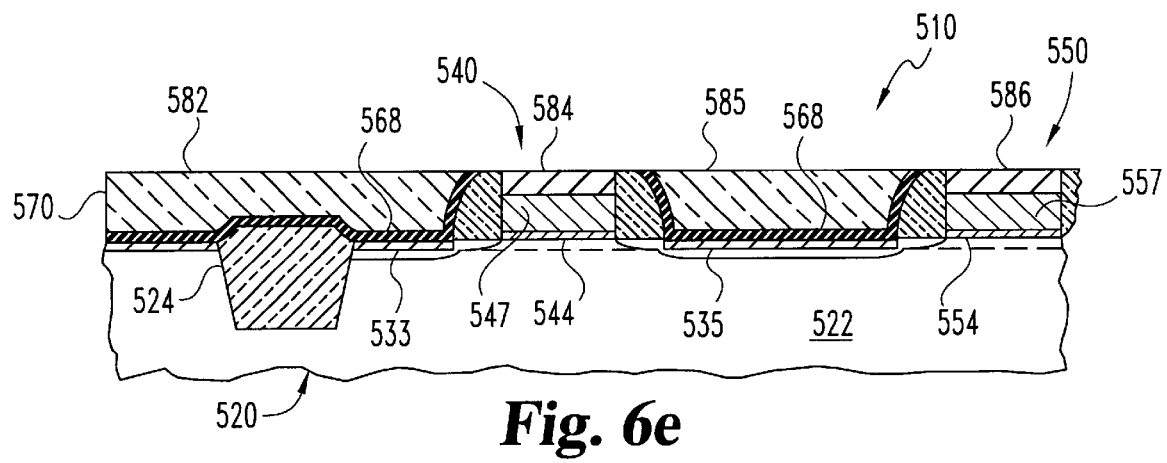

In FIG. 6e, metallic layer 580 has been removed to leave metallic layer members 584, 586 in recesses 549, 559, respectively. Layer members 584, 586 may be utilized as gate electrodes for gate structures 540, 550, respectively. Removal of layer 580 reexposes surface 572 or defines a surface substantially coplanar with surface 572 or substantially parallel to surface 572. In one embodiment, metallic layer 580 is removed through a compatible CMP planarization process. In another embodiment, layer 580 is partially removed by a conventional etching process.

From the stage shown in FIG. 6e, the formation of device 520, including transistor structures 526, 528, is completed. In one embodiment, completion of device 520 includes depositing an IMO layer on surface 582 followed by photolithographic definition of metal contact vias through the IMO layer. These vias are configured to provide for electrical interconnection to layer members 584, 586 through the IMO layer. In other embodiments, formation of device 520 is completed using techniques known to those skilled in the art.

Among the advantages of process 510 is the ability to maintain low gate electrode resistance with members 584, 586 despite diminishing gate dimensions. In one preferred embodiment of device 520, polysilicon layer members 542, 552 are about 2000 to 3000 Angstroms thick and corresponding recesses 549, 559 are each formed to be about 1000 Angstroms in depth. A gate sheet resistance of about 1 Ω/sq for gates 540, 550, requires a thickness of about 300, 600, 200 Angstroms of Al, W or Cu, respectively, given the corresponding resistivity approximation for Al, W, Cu of 3, 6, and 2 $\mu\Omega$cm. Thus, for this embodiment, a 1000 Angstrom recess 549, 559 filled with Al, W, or Cu will provide a sheet resistance of about 0.3, 0.6, or 0.2 Ω/sq, respectively.

Figure 7A:
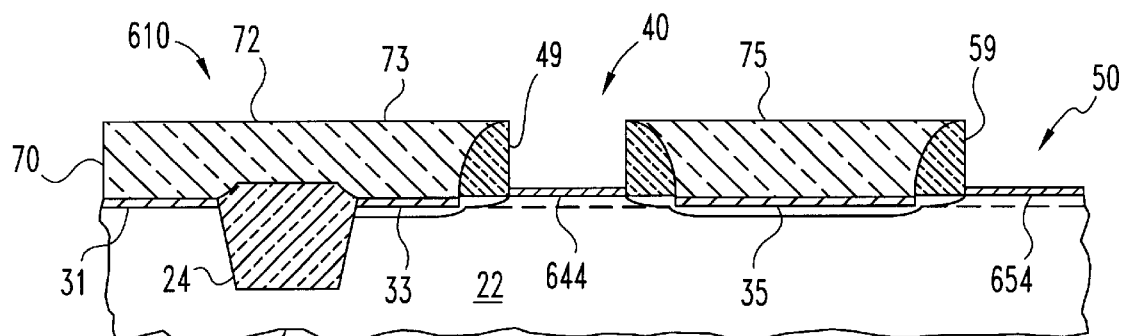
FIGS. 7a–7c are partial cross-sectional views a semiconductor device at certain progressive stages of a second self-aligned metallization process of the present invention.
Figure 7B:
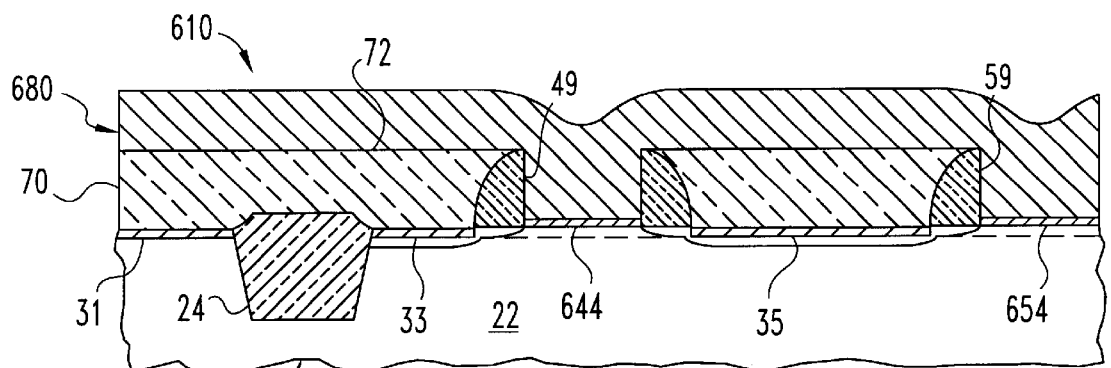
Figure 7C:
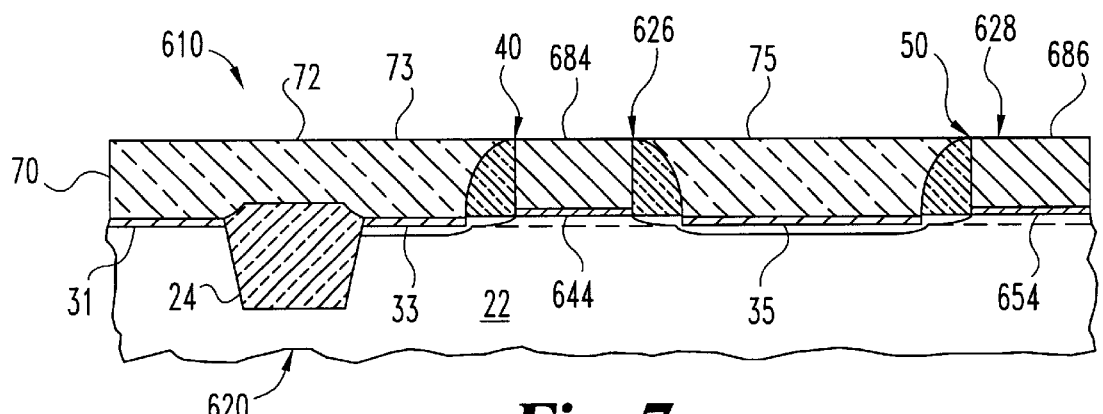

Certain stages of process 610 for manufacturing integrated circuit semiconductor device 620 are progressively illustrated in FIGS. 7a–7c. Process 610 begins with the stages of process 10 corresponding to FIGS. 1a–1e with like reference numerals identifying like features. After the self-aligned exposure of polysilicon surfaces 43, 53 in the stage represented by FIG. 1e, polysilicon layer members 42, 52 are selectively removed using conventional techniques to define gate trenches 49, 59 as illustrated in FIG. 7a. Preferably, a dry plasma etch technique is used to remove polysilicon layer members 42, 52. A portion of gate oxide layer members 44, 54 may also be removed during the polysilicon etch. As a result, the gate oxide is surface cleaned and a controlled gate oxide regrowth is performed using conventional techniques to provide gate oxide pads 644, 654 corresponding to gates 40, 50 of device 620. The regrowth of gate oxide pads 644, 654, may be achieved, for example, by conventional furnace oxidation or rapid thermal oxidation.

As illustrated in FIG. 7b, metallic layer 680 is deposited to fill trenches 49, 59 and cover surface 72. Layer 680 is in contact with gate oxide pads 644, 654. Preferably, metallic layer 680 is composed of Al, W, or W with a TiN adhesion layer; however, other elemental metals and alloys are envisioned as would occur to those skilled in the art.

FIG. 7c depicts the removal of a portion of metallic layer 680 to define metal gate members 684, 686 for gates 40, 50, respectively. Preferably, removal of layer 680 is performed by a compatible CMP or etch back technique known to those skilled in the art to reexpose surface 72. Formation of device 620 and metal gate transistors 626, 628 defined by process 610 may then be completed. In one embodiment, completion of device 620 includes depositing an IMO layer and photolithographically providing vias for metal contact interconnections to metal gate members 684, 686. In alternative embodiments, other techniques known to those skilled in the art are utilized to complete device formation.

Process 610 may be used to provide a viable alternative to polysilicon gate compositions. Moreover, because gate oxide pads 44, 54 may be regrown to form corresponding pads 644, 654, pads 44, 54 may be used as a sacrificial liner aimed at protecting substrate 22. As a result, in one embodiment pads 44, 54 are grown relatively thick, preferably about 60 to 150 Angstroms, to reduce the risk of damage to substrate 22.

In another embodiment, trenches 49, 59 are not filled, but rather have a recessed thickness sufficient to cover pads 644, 654 and provide a sheet resistance that is satisfactory for performance of device 620. In still other embodiments, layers 70, 680 may not be of uniform thickness or coverage, and surface 72 may be substantially uneven; however, coverage of layer 70 is sufficient to permit exposure of polysilicon surfaces 43, 53 for self-aligned processing in accordance with the present invention.

Ohmic resistors are basic components of IC circuits that may be found in analog devices and mixed in with digital circuits. Line or strips of polysilicon may be doped to provide a controlled resistance. Heavily doped polysilicon resistors having a sheet resistance between 100–300 Ohms per square are often suitable for making resistors in a relatively small area on integrated circuits. Unfortunately, the formation of polysilicon resistors is generally incompatible with the formation of self-aligned silicidation of polysilicon gates. Yet, the need for polysilicon resistors along side silicided polysilicon gates remains—especially for hybrid devices having both analog and digital circuitry. FIGS. 8a–8e progressively depict certain stages of polysilicon resistor formation process 710 of another embodiment of the present invention. Process 710 facilitates self-aligned silicidation of polysilicon transistor gates without silicidation of adjacent polysilicon strips designated to serve as resistors. Process 710 also facilitates self-aligned silicidation of adjacent transistors with low cost and simplicity.

Figure 8A:
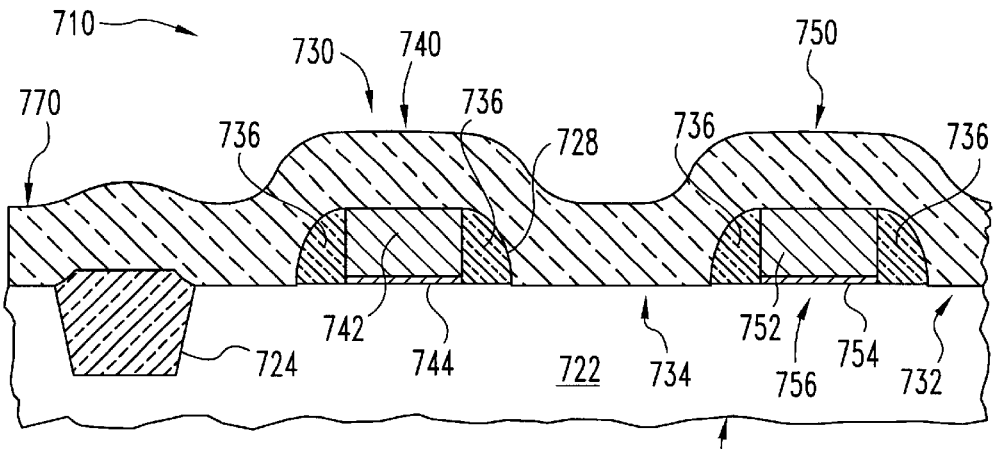
FIGS. 8a–8e are partial cross-sectional views a semiconductor device at certain progressive stages of a polysilicon resistor formation process of the present invention.

Referring to FIG. 8a, integrated circuit semiconductor device 720 is illustrated. Device 720 includes component region 730 having component structure 740 and component structure 750 each extending from generally planar silicon substrate 722. Structures 740, 750 are spaced apart from each other to define a fill gap 728 therebetween. Device 720 has isolation structure 724 opposite component region 730.

Structure 740 includes polysilicon layer line or strip 742 on top of gate oxide pad 744 configured for operation as a polysilicon resistor for device 720. In addition, strip 742 is bounded by spacer walls 736. Spacer walls 736 are spaced apart from each other along substrate 722. Structure 750 includes polysilicon strip 752 on top of gate oxide pad 754. In addition, strip 752 is bounded by spacer walls 736.

Structure 750 is configured to be formed into a field effect transistor, having source region 732, drain region 734, and channel region 756 positioned under gate oxide pad 754.

Figure 8B:
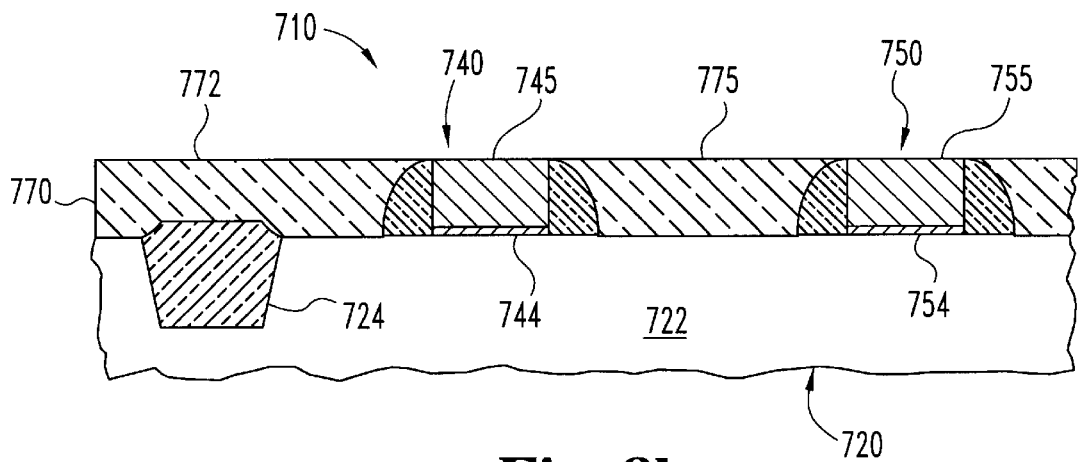
Figure 8C:
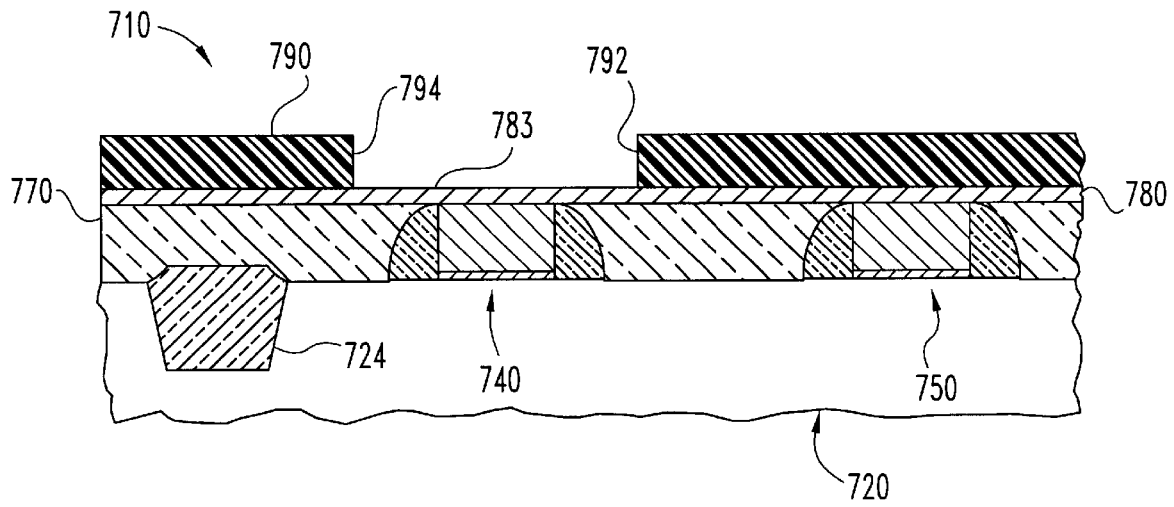

Dielectric layer 770 is deposited on top of the uneven topography of structures 740, 750, filling gap 728. Preferably, layer 770 is made of an oxide of silicon. In FIG. 8b, a portion of layer 770 has been removed, preferably by a planarizing CMP procedure compatible with the composition of dielectric layer 770. The planarization of layer 770 selectively exposes polysilicon surface 745 of structure 740 and surface 755 of structure 750 and defines generally planar layer surface 772 with layer member 775 positioned between structures 740 and 750 in gap 728. At this stage, surfaces 745, 755, and 772 are generally coplanar.

FIG. 8b depicts the addition of metallic layer 780 over surface 772. Metallic layer 780 is formed from a metallic material suitable for subsequent silicidation of polysilicon in contact therewith. In one embodiment, metallic layer 780 is primarily comprised of elemental Ti. In other embodiments, metallic layer 780 may be composed of Co or Ni. Resist Pattern 790 of resist layer 792 is positioned on metallic layer 780. Pattern 790 is formed using conventional photolithographic techniques. Pattern 790 defines opening 794 over structure 740 to expose surface 783 of metallic layer 780. In contrast, structure 750 is covered by resist layer 792.

Figure 8D:
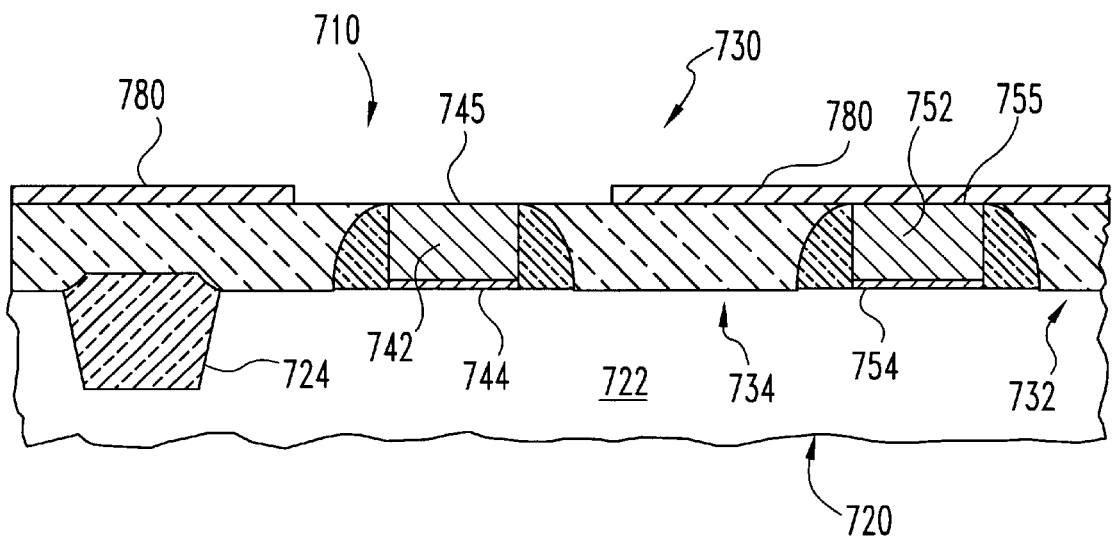

In FIG. 8d, metallic layer 780 has been etched away in correspondence with opening 794 to remove the metallic layer from over structure 740, thereby reexposing surface 745. In contrast, metallic layer 780 remains over structure 750 in contact with surface 755 after etching. A conventional dry or wet etch is applied to selectively remove the portion of metallic layer 780 over opening 794 followed by stripping pattern 790. If a wet etch is selected to remove metallic layer 780, preferably a dilute hydrofluoric acid, HF, is applied. It is also preferred that pattern 790 be stripped using a chemical compatible with metallic layer 790, such as ozone fusion ash.

Figure 8E:
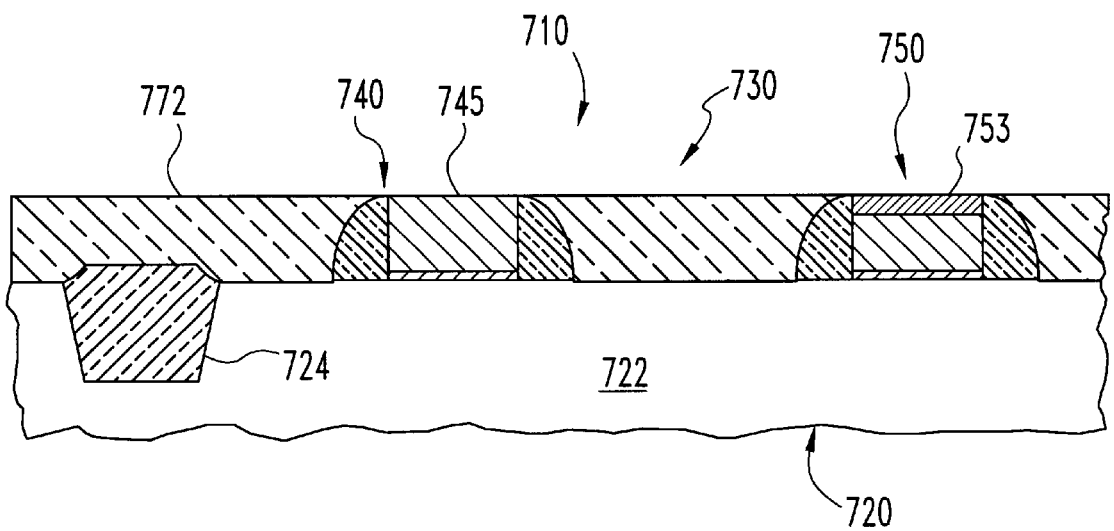

In FIG. 8e, silicide layer 753 of structure 750 is depicted. For the embodiment utilizing Ti as the primary constituent of layer 780, a first RTA is performed by heating device 720 to a temperature of about 720 degrees celsius for about 30 seconds. For This embodiment, completion of device 720 includes stripping the remaining portion of the Ti metallic layer 780 by a wet etch process and performing a second RTA by heating device 720 to a temperature of about 850 degrees Celsius for about 30 seconds. The second RTA transforms silicide layer 753 from a C49-TiSi$_2$ crystal structure to a C54-TiSi$_2$ crystal structure. In an alternative embodiment, the photolithographic definition of pattern 790 is enhanced by the addition of an antireflective coating such as a thin TiN layer, about 50 to 300 'Angstroms thick, which is compatible with the subsequent silicidation of structure 750 when layer 780 is composed of Ti. In other embodiments, the silicidation procedure may be performed as would occur to those skilled in the art.

It should be understood that process 710 permits the selective self-aligned silicidation of structure 750 to facilitate its application as a field effect transistor, while preventing silicidation of structure 740 which would preclude its operation as an effective polysilicon resistor. After silication of structure 750, formation of device 720, including the formation of structure 740 as a polysilicon resistor and structure 750 as a field effect transistor, is completed using techniques known to those skilled in the art.

Among the features of the present invention is the self-aligned processing of selected features of a semiconductor device by coating one or more selected features extending or projecting from a semiconductor substrate of the device. Preferably, the coating is a process selective dielectric material such as silicon dioxide or silicon nitride. The coating portion positioned farthest from the substrate is then removed to expose a portion of the previously coated features for self-aligned processing. A portion of the exposed features may also be removed to become generally coplanar with the remaining coating. The remaining portion of the coating still covers other regions of the device, blocking these regions from participation in the self-aligned processes that are applied to the features exposed by coating removal.

In the preferred embodiments, the coating removal process defines a generally planar surface to facilitate subsequent processing at the same time the projecting feature or features are exposed; however, in other embodiments the coating may not be uniform in thickness and may present a substantially uneven device topology before and after removal. Nonetheless, the progressive removal of the coating farthest from the substrate in these embodiments, to in turn progressively reduce thickness (or height) of the device and thereby expose surfaces of features farthest away from the substrate is within the spirit of the present invention. Such an embodiment may include providing one or more planar regions along the substrate that each correspond to an exposed feature. These regions may be joined by lower, uneven surfaces positioned therebetween.

For the integrated circuit 20 and devices 220, 320, 420, 520, 620, 720 of the present invention, only a few semiconductor device features are illustrated for clarity; however, it is preferred that a large number of semiconductor device features be spaced along the corresponding substrate for simultaneous processing in accordance with the present invention. Furthermore, in other embodiments of the present invention, silicidation of silicidation of drain and source regions may not be necessary. Also, it should be understood that the depicted arrangement of transistors, resistors, trenches, and other structures and components in connection with processes 10, 210, 310, 410, 510, 610, and 710 of the drawings are intended to be illustrative only—the present invention contemplating different arrangements of transistors and other semiconductor components and component types as would occur to those skilled in the art.

It is also contemplated that processes 10, 210, 310, 410, 510, 610, and 710 of the present invention could be altered, rearranged, substituted, deleted, duplicated, combined, or added to other processes as would occur to those skilled in the art without departing from the spirit of the present invention. In addition, the various stages, steps, procedures, techniques, phases, and operations within these processes may be altered, rearranged, substituted, deleted, duplicated, or combined as would occur to those skilled in there art.

All publications, patents, and patent applications cited in this specification are herein incorporated by reference as if each individual publication, patent, or patent application were specifically and individually indicated to be incorporated by reference and set forth in its entirety herein.

While the invention has been illustrated and described in detail in the drawings and foregoing description, the same is to be considered as illustrative and not restrictive in character, it being understood that only the preferred embodiments haves been shown and described and that all changes and modifications that come within the spirit of the invention are desired to be protected.

What is claimed is:

1. A process for manufacturing an integrated circuit, comprising the steps of:
    (a) defining a region of a silicon substrate for formation of a field effect transistor, the region being bounded by a field isolation structure, the region including a source, a drain, and a gate positioned between the source and drain, the gate including a gate oxide pad formed on the substrate and a polysilicon gate member formed on the gate oxide pad, the polysilicon member having a thickness extending above the source and drain and being bounded by a pair of spacer walls;
    (b) covering the source, the drain, the gate, and the spacer walls with a silicon nitride liner;
    (c) depositing a silicon dioxide layer on the silicon nitride liner, at least a portion of the silicon nitride liner and the silicon dioxide layer providing a combined thickness greater than the thickness of the polysilicon member;
    (d) removing a portion of the silicon dioxide layer by chemical mechanical polishing to expose the polysilicon member without exposing the source or drain, step (d) defining a first generally planar surface;
    (e) etching the polysilicon member exposed by step (d) to controllably form a recess in the first generally planar surface;
    (f) performing a self-aligned silicidation process to form a silicide layer in the recess; and
    (g) providing a silicon nitride layer, the silicon nitride layer filling the recess and covering the first generally planar surface;
    (h) removing part of the silicon nitride layer to reexpose the silicon dioxide layer and leave a portion of the silicon nitride layer in the recess on the silicide layer; and
    (i) completing formation of the field effect transistor.

2. A method of manufacture, comprising:
    (a) providing a transistor gate extending from a semiconductor substrate adjacent a connection region along the substrate, the gate having an insulative member on a conductive layer, the insulative member and the conductive layer being positioned between a pair of dielectric spacers, the region being covered by a barrier layer, a first dielectric layer being positioned on the barrier layer;
    (b) etching a trench through the first dielectric layer selective to the barrier layer and the insulative member, said etching exposing at least a portion of the insulative member and the barrier layer;
    (c) removing the barrier layer and reducing thickness of the insulative member exposed by said etching; and
    (d) depositing a conductive metallic material in the trench to contact the connection region and the insulative member, the insulative member providing electrical isolation of the conductive layer from the conductive metallic material.

3. The method of claim 2, wherein the insulative member is formed by defining a recess in the gate and generally filling the recess with silicon nitride, the barrier layer is comprised of silicon nitride, and the first dielectric layer is comprised of silicon dioxide.

4. The method of claim 2, wherein the insulative member has a thickness greater than a thickness of the barrier layer prior to said removing.

5. The method of claim 2, wherein said providing includes:

(a1) coating the gate and the barrier layer with the first dielectric layer;

(a2) chemically-mechanically polishing the first dielectric layer to expose a surface of the gate in a self-aligned manner;

(a3) etching the gate after said polishing to define a recess in the gate;

(a4) blanketing the gate and the first dielectric layer with an insulative material, the insulative material generally filling the recess; and (a5) removing the insulative material outside of the recess to form the insulative member therein.

6. The method of claim 5, further comprising forming a metallization layer in the recess prior to said blanketing, the conductive layer being comprised of the metallization layer.

7. The method of claim 2, further comprising establishing a second dielectric layer on the first dielectric layer prior to said etching and wherein said etching includes forming the trench through the second dielectric layer, the first and second dielectric layers being mutually etched selective to the barrier layer and the insulative member.

8. The method of claim 2, wherein said etching is performed in accordance with a misaligned pattern.

9. A method of manufacture, comprising:
(a) providing a device having a number of transistor gates spaced apart from each other along a semiconductor substrate, a portion of the substrate positioned between the gates being covered with a dielectric material, the gates and the dielectric material being planarized to provide for self-aligned processing of the gates;

(b) forming a recess in each of the gates; and (c) depositing an insulative material in the recess of each of the gates, the insulative material being on a conductive portion of each of the gates, the insulative material being etch selective to the dielectric material to reduce inadvertent exposure of the conductive portion of each of the gates when the dielectric material is etched to form electrical interconnections, wherein said providing includes forming a barrier layer on the substrate that is positioned under the dielectric material, the barrier layer and the insulative material are mutually etch selective to the dielectric material, and the insulative material has a greater thickness than the barrier layer.

10. A method of manufacture, comprising:
(a) providing a device having a number of transistor gates spaced apart from each other along a semiconductor substrate, the gates extending away from the substrate;

(b) establishing a dielectric layer on the substrate and the gates;

(c) chemically-mechanically polishing the device to provide self-aligned exposure of a polysilicon member of each of the gates, a portion of the dielectric layer covering the substrate that is positioned between the gates after said polishing;

(d) removing at least a portion of the polysilicon member of each of the gates to form a corresponding number of recesses in the gates after said polishing; and (e) depositing material in the recess of each of the gates, the material being selected in accordance with a pattern of electrical interconnections of the device.

11. The method of claim 10, wherein the material includes silicon nitride to provide electrical isolation of each of the gates from a misaligned metal contact member.

12. The method of claim 10, further comprising etching the dielectric layer selective to the material.

13. The method of claim 12, further comprising etching the material selective to the dielectric layer.

14. The method of claim 10, wherein said depositing includes placing a metallic material in the recess of each of the gates.

15. A method of manufacture, comprising:
(a) providing a device having a number of transistor gates spaced apart from each other along a semiconductor substrate, a portion of the substrate positioned between the gates being covered with a dielectric material, the gates and the dielectric material being planarized to provide for self-aligned processing of the gates;

(b) forming a recess in each of the gates; and (c) depositing an insulative material in the recess of each of the gates, the insulative material being on a conductive portion of each of the gates, the insulative material being etch selective to the dielectric material to reduce inadvertent exposure of the conductive portion of each of the gates when the dielectric material is etched to form electrical interconnections, wherein a barrier layer is positioned between the dielectric material and the portion of the substrate positioned between the gates.

16. The method of claim 10, further comprising forming a silicided surface along the substrate.

17. A method, comprising:
providing a device with a transistor gate extending from a substrate adjacent a contact region along the substrate;

depositing a barrier layer on the gate and the contact region;

establishing a first dielectric layer on the barrier layer;

planarizing the first dielectric layer, said planarizing removing a portion of the barrier layer on the gate;

forming a recess in the gate after said planarizing;

forming an insulating member in the recess;

etching a trench through the first dielectric layer after the insulating member is formed to expose the barrier layer over the contact region, said etching being selective to the barrier layer and the insulating member, the trench being misaligned to overlap at least a portion of the gate;

removing an exposed portion of the barrier layer after said etching to expose the contact region after said etching; and depositing a metallic material in the trench, the metallic material being in contact with the insulating member and the contact region, the insulating member electrically insulating the gate from the metallic material.

18. The method of claim 17, further comprising depositing a second dielectric layer on the first dielectric layer after said forming an insulating member and before said etching, and said etching includes etching the trench through the second dielectric layer.

19. The method of claim 17, wherein the contact region includes a silicided surface in contact with the metallic material after the metallic material is deposited in the trench.

20. The method of claim 17, wherein the gate includes a polysilicon member exposed in said recess, and further comprising performing a silicidation process including depositing a metal layer in the recess and annealing the device before the insulating member is formed to provide a silicide layer between the polysilicon member and the insulating member.

21. A method of manufacture, comprising:
(a) providing a transistor gate extending from a semiconductor substrate adjacent a connection region along the substrate, the gate having a polysilicon member separated from the surface of the substrate;

(b) covering the connection region with a barrier layer and the barrier layer with a first dielectric layer;

(c) removing a portion of the barrier layer and the first dielectric layer to expose the polysilicon member;

(d) removing a portion of the polysilicon member to form a recess in the gate;

(e) depositing an insulative member in the recess, the member being on a conductive layer of the gate;

(f) performing an etch selective to the barrier layer and the insulative member to form a trench through the first dielectric layer that exposes the barrier layer and the insulative member;

(g) simultaneously etching the barrier layer and the insulative member selective to the first dielectric layer to expose the connection region and reduce thickness of at least a portion of the insulative member; and (h) depositing a metallic conductive material in the trench to electrically contact the connection region, the insulative member electrically isolating the conductive material in the trench from the conductive layer of the gate.

* * * * *